(12) United States Patent
Suttle et al.

(10) Patent No.: US 11,880,742 B2
(45) Date of Patent: Jan. 23, 2024

(54) JOSEPHSON DOUBLE BALANCED COUPLER

(71) Applicant: International Business Machines Corporation, Armonk, NY (US)

(72) Inventors: Joseph Robert Suttle, Chappaqua, NY (US); Matthew Beck, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 722 days.

(21) Appl. No.: 17/060,809

(22) Filed: Oct. 1, 2020

(65) Prior Publication Data

US 2022/0108200 A1    Apr. 7, 2022

(51) Int. Cl.
    G06N 10/00    (2022.01)
    H10N 60/12    (2023.01)
    H10N 60/80    (2023.01)

(52) U.S. Cl.
    CPC ............. *G06N 10/00* (2019.01); *H10N 60/12* (2023.02); *H10N 60/805* (2023.02)

(58) Field of Classification Search
    CPC ...... G06N 10/00; H10N 60/12; H10N 60/805; H10N 60/10
    See application file for complete search history.

(56) References Cited

U.S. PATENT DOCUMENTS 9,806,711 B1 * 10/2017 Abdo ..................... G06N 10/00
10,056,885 B2    8/2018 Abdo
10,262,276 B2    4/2019 Puri et al.
10,291,227 B2    5/2019 Abdo
10,345,678 B2    7/2019 Abdo
10,541,659 B2    1/2020 Abdo et al.

OTHER PUBLICATIONS

Abdo et al., "Non-degenerate, three-wave mixing with the Josephson ring modulator," arXiv:1208.3142v1 [cond-mat. supr-con], Aug. 15, 2012, 21 pages.
Bergeal et al., "Analog information processing at the quantum limit with a Josephson ring modulator," arXiv:0805.3452v2 [cond-mat.mes-hall], Oct. 22, 2009, 24 pages.
Leib et al., "A transmon quantum annealer: decomposing many-body Ising constraints into pair interactions," Quantum Sci. Technol. 1 (2016) 015008, 16 pages.
McKay et al., "A universal gate for fixed-frequency qubits via a tunable bus," arXiv:1604.03076v3 [quant-ph], Dec. 19, 2016, 10 pages.
Naaman et al., "Josephson junction microwave modulators for qubit control," arXiv:1610.07987v2 [cond-mat.supr-con], Feb. 22, 2017, 18 pages.

(Continued)

*Primary Examiner* — Jung Kim

(74) *Attorney, Agent, or Firm* — Amin, Turocy & Watson, LLP

(57) ABSTRACT

Techniques facilitating a quantum gate between qubits using a tunable coupler are provided. In one example, a quantum coupler device can comprise a Josephson ring modulator (JRM) that is operatively coupled to first and second qubits in a balanced bridge topology via respective first and second capacitive devices. The JRM provides tunable coupling between the first and second qubits.

24 Claims, 26 Drawing Sheets

(56) References Cited

OTHER PUBLICATIONS

Malekakhlagh et al., "First-principles analysis of cross-resonance gate operation," arXiv:2005.00133v2 [quant-ph], May 5, 2020, 30 pages.
Chen et al., "Qubit Architecture with High Coherence and Fast Tunable Coupling," Phys. Rev. Lett. 113, 220502, Nov. 26, 2014, 5 pages.
International Search Report and Written Opinion received for PCT Application Serial No. PCT/EP2021/076745 dated Feb. 18, 2022, 13 pages.
Hagen et al., "A Josephson Impedance Bridge Based on Programmable Josephson Voltage Standards", IEEE Transactions on Instrumentation and Measurement, IEEE, USA, XP011648769, vol. 66, No. 6, Jun. 1, 2017, pp. 1539-1545.
Examination Report received for Australian Application Ser. No. 2021353034 dated Jul. 18, 2023, 4 pages.
Response dated Nov. 17, 2023 to Communication pursuant Rules 161(1) and 162 EPC dated May 12, 2023 for EP Application No. EP21786175.6.

\* cited by examiner

JOSEPHSON DOUBLE BALANCED COUPLER

BACKGROUND

The subject disclosure relates to a quantum coupler device, and more specifically, to a quantum coupler device facilitating a quantum gate between quantum bits (qubits).

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate a quantum gate between qubits using a tunable coupler are described.

According to an embodiment, a quantum coupler device can comprise a Josephson ring modulator (JRM) that is operatively coupled to first and second qubits in a balanced bridge topology via respective first and second capacitive devices. The JRM provides tunable coupling between the first and second qubits.

In an embodiment, the quantum coupler device can further comprise a biasing component that applies a bias to the JRM to facilitate control of coupling between the first and second qubits. In an embodiment, the first and second qubits remain decoupled until the bias is applied to the JRM. In an embodiment, the biasing component applies a radio frequency (RF) charge bias signal to the JRM to drive parametric conversion between the first and second qubits. In an embodiment, the biasing component applies a RF flux bias signal to the JRM to drive parametric conversion between the first and second qubits. In an embodiment, the RF charge bias signal and/or the RF flux bias signal comprise a difference frequency defined by respective frequencies of the first and second qubits.

In an embodiment, the first and second qubits are degenerate qubits. In this embodiment, application of a DC flux bias signal to the JRM drives an excitation swap between the first and second qubits. In an embodiment, the first and second qubits are non-degenerate qubits. In this embodiment, application of a DC flux bias signal to the JRM drives ZZ interaction between the first and second qubits. In an embodiment, the quantum coupler device can further comprise a flux bias line built on an interposer that forms a loop under the JRM. In an embodiment, the flux bias line comprises an incoming flux bias line and a return path routed alongside of the incoming flux bias line. In an embodiment, the first capacitive devices are formed inside a paddle of the first qubit.

According to another embodiment, a computer-implemented method can comprise operatively coupling a JRM to first and second qubits in a balanced bridge topology via respective first and second capacitive devices. The computer-implemented method can further comprise using the JRM to tuneably couple the first and second qubits.

In an embodiment, the computer-implemented method can further comprise applying a bias to the JRM to facilitate control of coupling between the first and second qubits. In an embodiment, the first and second qubits remain decoupled until the bias is applied to the JRM. In an embodiment, the computer-implemented method can further comprise controlling polarity of the coupling between the first and second qubits by adjusting polarity of the bias applied to the JRM.

In an embodiment, the computer-implemented method can further comprise applying a RF charge bias signal to the JRM to drive parametric conversion between the first and second qubits. In an embodiment, the computer-implemented method can further comprise applying a RF flux bias signal to the JRM to drive parametric conversion between the first and second qubits. In an embodiment, the first and second qubits are degenerate qubits. In this embodiment, the computer-implemented method can further comprise applying a DC flux bias signal to the JRM to drive an excitation swap between the first and second qubits. In an embodiment, the first and second qubits are non-degenerate qubits. In this embodiment, the computer-implemented method can further comprise applying a DC flux bias signal to the JRM to drive ZZ interaction between the first and second qubits.

According to another embodiment, a quantum coupling system can comprise a Josephson ring modulator (JRM), a first qubit, and a second qubit. The first qubit is coupled to the JRM via a first inductive component. The second qubit is coupled to the JRM via a second inductive component. The first and second qubits are coupled to the JRM via the respective first and second inductive devices in a balanced bridge topology. The JRM can provide tunable coupling between the first and the second qubits. In an embodiment, the system further comprises a biasing component that applies a bias to the JRM to control coupling between the first and second qubits. In an embodiment, the first and second qubits remain decoupled until a bias is applied to the JRM.

DETAILED DESCRIPTION

Figure 1:
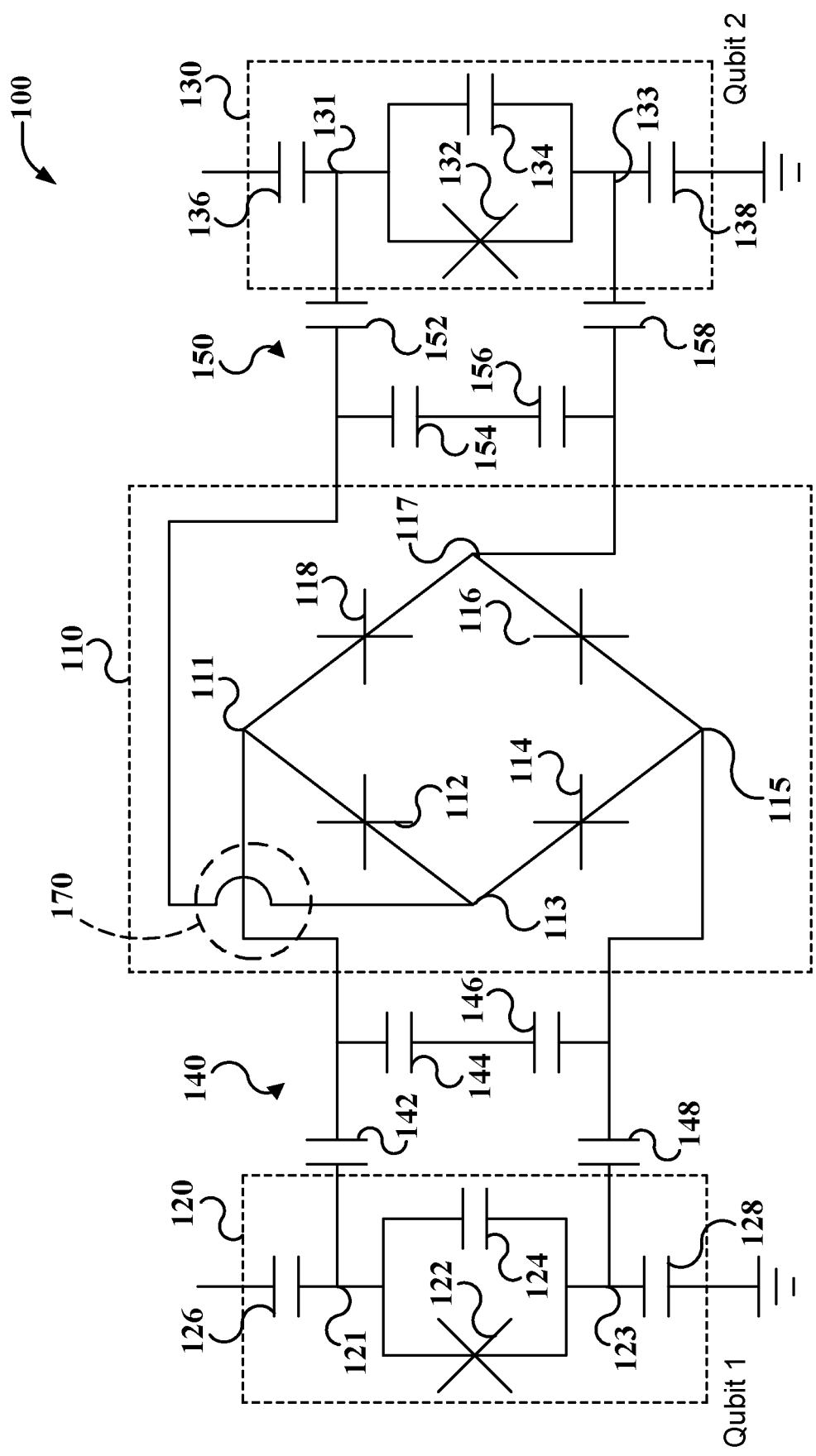
FIGS. 1-4 illustrate circuit schematics of example, non-limiting devices that can facilitate a quantum gate between qubits using a Josephson ring modulator (JRM), in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Classical computers operate on binary digits (or bits) that store or represent information as binary states to perform computing and information processing functions. In contrast, quantum computing devices operate on quantum bits (or qubits) that store or represent information as both the binary states and superpositions of the binary states. To that end, quantum computing devices utilize quantum-mechanical phenomena, such as entanglement and interference.

A quantum computation uses a qubit as its essential unit instead of a classical computing bit. The qubit (e.g., quantum binary digit) is the quantum-mechanical analog of the classical bit. Whereas classical bits can employ on only one of two basis states (e.g., 0 or 1), qubits can employ superpositions of those basis states (e.g., $\alpha|0>+\beta|1>$, where $\alpha$ and $\beta$ are complex scalars such that $|\alpha|^2+|\beta|^2=1$), allowing a number of qubits to theoretically hold exponentially more information than a same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, etc. Qubits, partaking of the quantum mystique, can occupy a superposition of 0 and 1 states. It's not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1. General quantum programs require coordination of quantum and classical parts of a computation. One way to think about general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of a computation is neither its source language description nor the target machine instructions, but something in between. Compilers may use several IRs during a process of translating and optimizing a program. The input is source code describing a quantum algorithm and compile time parameter(s). The output is a combined quantum/classical program expressed using a high-level IR. A distinction between a quantum and classical computer is that the quantum computer is probabilistic, thus measurements of algorithmic outputs provide a proper solution within an algorithm specific confidence interval. The computation is then repeated until a satisfactory probable certainty of solution can be achieved.

By processing information using laws of quantum mechanics, quantum computers offer novel ways to perform computation tasks such as molecular calculations, financial risk calculations, optimization and many more.

A key element of a nontrivial quantum computing device is the two-qubit gate which facilitates information exchange between neighboring qubits. Current techniques in the coupling of two qubits employ a multitude of different methods each with their own strengths and weaknesses in terms of gate speed, fidelity, and ease of operation.

For example, viable cross-resonance gates generally involve neighboring qubits that are relatively close in frequency (e.g., within an anharmonicity), but not actually overlapping. This forces stringent requirements on the frequencies of coupled qubit pairs. As another example, techniques employing static coupling (e.g., using a capacitor) between neighboring qubits generally must deal with qubit-qubit interactions that are always ON even when an associated controller is not actively executing a two-qubit gate. Cross-resonance gate architectures can reduce residual crosstalk between neighboring qubits using an intermediate qubit. While intermediate qubits can reduce residual crosstalk to a relatively low level, the reduced residual crosstalk is not zero. In some instances, residual crosstalk can result in unintentional coherent rotations or coherent qubit errors, which negatively impacts gate fidelity.

FIG. 1 illustrates a circuit schematic of an example, non-limiting device 100 that can facilitate a quantum gate between qubits using a Josephson ring modulator (JRM), in accordance with one or more embodiments described herein. As illustrated by the example embodiment depicted in FIG. 1, device 100 includes a JRM 110, a first qubit 120, a second qubit 130, first capacitive devices 140, and second capacitive devices 150. JRM 110 comprises four Josephson Junctions (JJs) 112, 114, 116, and 118 that are arranged in a ring configuration. In an embodiment, the ring configuration is a Wheatstone bridge configuration.

Figure 5A:
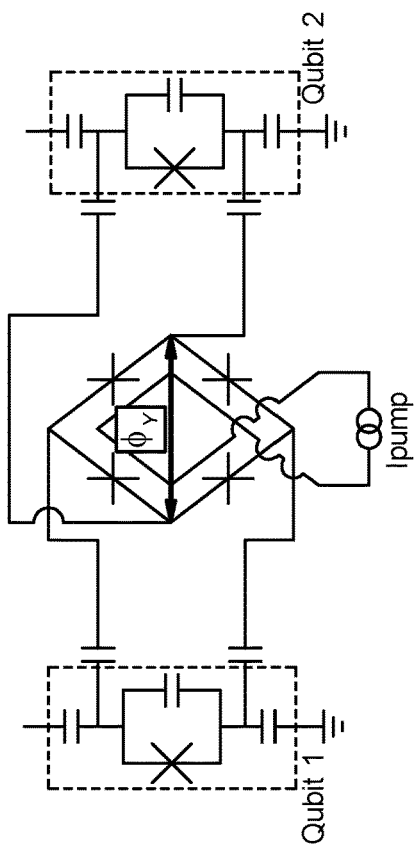
FIGS. 5A-5D illustrate example, non-limiting respective modes of a JRM and qubits, in accordance with one or more embodiments described herein.
Figure 5B:
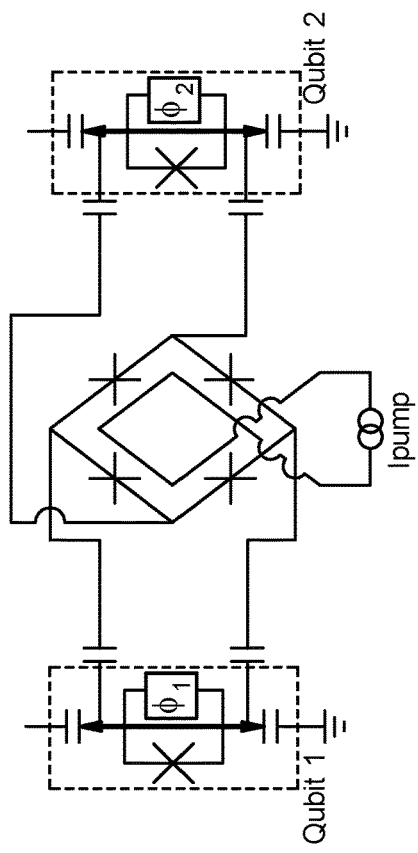
Figure 5C:
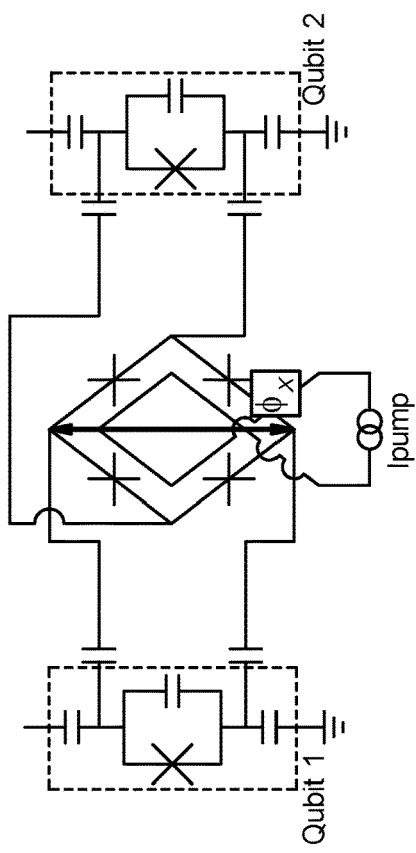

One skilled in the art will recognize that JRM 110 comprises three orthogonal electrical modes. With reference to FIGS. 5A-5C, the three orthogonal electrical modes of JRM 110 include: an X mode that is represented by $\Phi_X$ in FIG. 5A; a Y mode that is represented by $\Phi_Y$ in FIG. 5B; and a Z mode that is represented by $\Phi_Z$ in FIG. 5C. In an embodiment, a Hamiltonian of JRM 110 can be approximated using the Hamiltonian defined by Equation 1:

$$H_{ring} = E_c[Q_X^2 + Q_Y^2 + Q_Z^2] - \\ 4E_j \left[ \cos\frac{\Phi_X}{2\phi_0}\cos\frac{\Phi_Y}{2\phi_0}\cos\frac{\Phi_Z}{2\phi_0}\cos\left(\frac{\Phi_{Bias}}{4\phi_0} + \frac{2\pi n}{\phi_0}\right) + \\ \sin\frac{\Phi_X}{2\phi_0}\sin\frac{\Phi_Y}{2\phi_0}\sin\frac{\Phi_Z}{2\phi_0}\sin\left(\frac{\Phi_{Bias}}{2\phi_0} + \frac{2\pi n}{\phi_0}\right) \right].$$

Equation 1

In accordance with Equation 1 above, $E_C$ denotes electrostatic charging energy of each Josephson Junction, $Q_X^2$ denotes the charge operator for mode X, $Q_Y^2$ denotes the charge operator for mode Y, $Q_Z^2$ denotes the charge operator for mode Z, $E_J$ denotes Josephson energy of each Josephson Junction, $\Phi_X$ denotes the flux operator for mode X, $\Phi_Y$ denotes the flux operator for mode Y, $\Phi_Z$ denotes the flux operator for mode Z, $\Phi_{Bias}$ denotes the applied flux bias, n is an integer, and $\phi_0$ denotes the superconducting magnetic flux quantum. As described in greater detail below, the JRM 110 can provide tunable coupling between first qubit 120 and second qubit 130.

First qubit 120 comprises a JJ 122 that is coupled in parallel with capacitive device 124. First qubit 120 further comprises capacitive device 128 that couples JJ 122 to ground. Second qubit 130 comprises a JJ 132 that is coupled in parallel with capacitive device 134. Second qubit 130 further comprises capacitive device 138 that couples JJ 132 to ground. Capacitive devices 126 and 136 couple first qubit 120 and second qubit 130, respectively, to external circuitry.

Figure 5D:
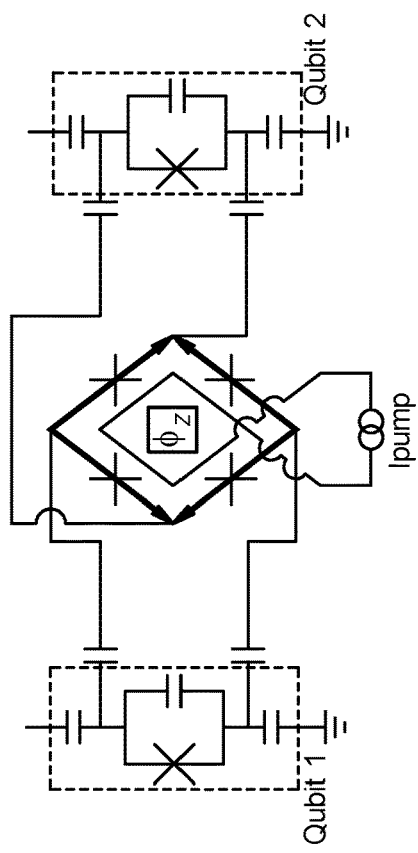

Examples of qubits that are suitable for implementing first qubit 120 and/or second qubit 130 include, but not limited to: a fixed frequency qubit, a tunable qubit, a transmon qubit, a fixed frequency transmon qubit, a tunable transmon qubit, and the like. With reference to FIG. 5D, first qubit 120 and second qubit 130 each comprise electrical modes that are represented by $\Phi_1$ and $\Phi_2$, respectively.

First capacitive devices 140 include capacitive device 142 that couples node 121 of first qubit 120 to node 111 of JRM 110 and capacitive device 148 that couples node 123 of first qubit 120 to node 115 of JRM 110. First capacitive devices 140 further include capacitive device 144 and capacitive device 146 that are coupled in parallel with JRM 110 via nodes 111 and 115. Second capacitive devices 150 include capacitive device 152 that couples node 131 of second qubit 130 to node 113 of JRM 110 and capacitive device 158 that couples node 133 of second qubit 130 to node 117 of JRM 110. Second capacitive devices 150 further include capacitive device 154 and capacitive device 156 that are coupled in parallel with JRM 110 via nodes 113 and 117.

Figure 2:
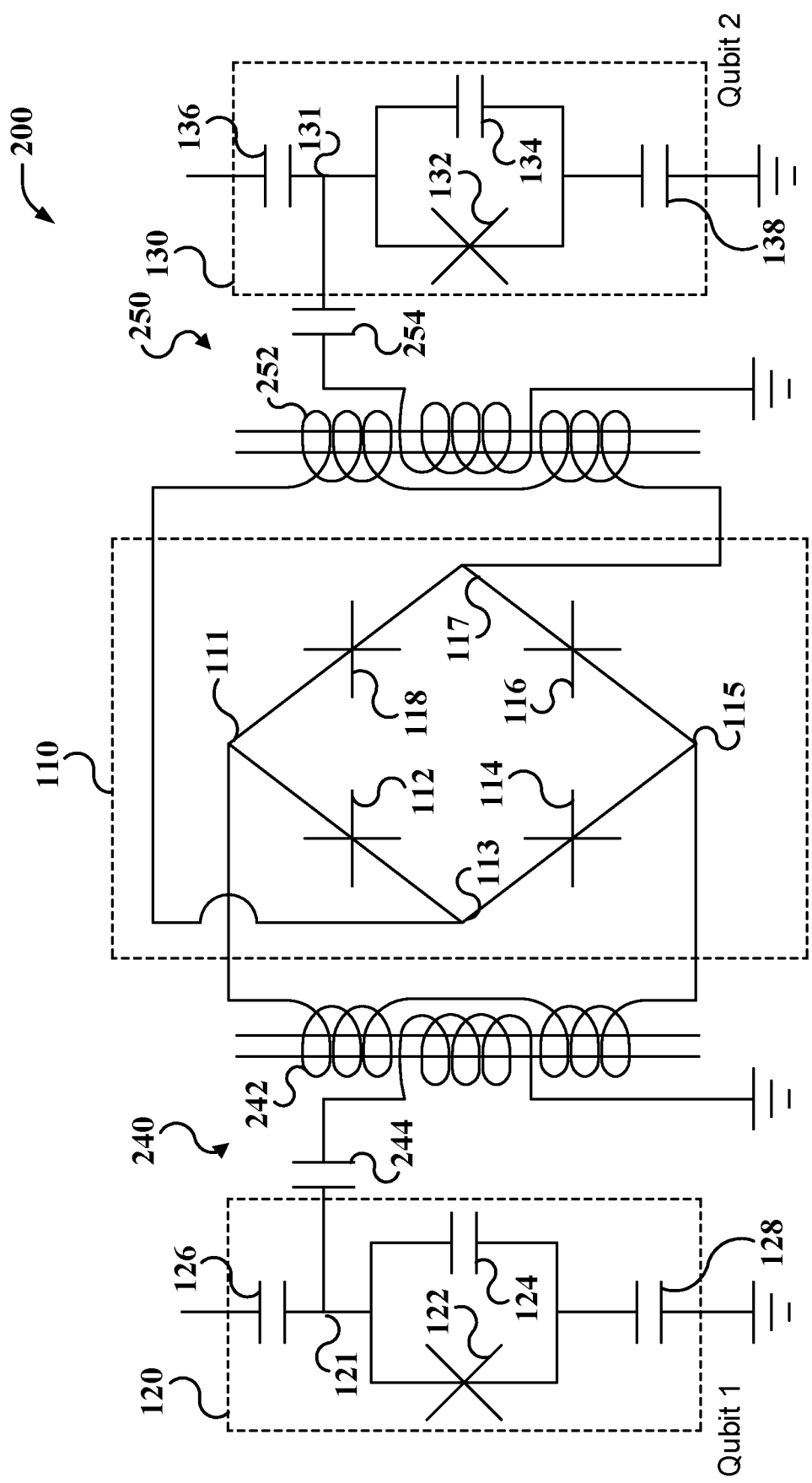

FIG. 2 illustrates a circuit schematic of another example, non-limiting device 200 that can facilitate a quantum gate between qubits using a JRM, in accordance with one or more embodiments described herein. Similar to device 100 of FIG. 1, device 200 also includes JRM 110, first qubit 120, and second qubit 130. As illustrated by FIG. 2, device 200 further includes first reactive devices 240 and second reactive devices 250.

First reactive devices 240 include inductive device 242 that is coupled in parallel with JRM 110 via nodes 111 and 115. First reactive devices 240 further include capacitive device 244 that intervenes between node 121 of first qubit 120 and inductive device 242. Second reactive devices 250 include inductive device 252 that is coupled in parallel with JRM 110 via nodes 113 and 117. Second reactive devices 250 further include capacitive device 254 that intervenes between node 131 of second qubit 130 and inductive device 252. In an embodiment, inductive device 242 and/or inductive device 252 can be implemented using three winding transforms with 1:1:1 turn ratios.

Various embodiments described herein relate to quantum coupling devices that facilitate two-qubit gates with zero quiescent coupling in an off-state and high coupling (e.g., >1 gigahertz (GHz)) in an on-state. To that end, neighboring qubits (e.g., first qubit 120 and second qubit 130) are connected across a JRM (e.g., JRM 110) in a balanced bridge topology. That balanced bridge topology can weakly couple modes of the JRM (e.g., the X, Y, and/or Z modes of JRM 110 depicted in FIGS. 5A-5C, respectively) to modes of the neighboring qubits (e.g., the modes of first qubit 120 and second qubit 130 depicted in FIG. 5D) via capacitors or mutual inductance.

For example, device 100 of FIG. 1 illustrates an embodiment in which neighboring qubits are capacitively coupled to a JRM to form a balanced bridge topology. In this example, JRM 110 is operatively coupled to first qubit 120 and second qubit 130 in a balanced bridge topology via first capacitive devices 140 and second capacitive devices 150, respectively. As another example, device 200 of FIG. 2 illustrates an embodiment in which neighboring qubits are mutually coupled to a JRM to form a balanced bridge topology. In this example, JRM 110 is operatively coupled to first qubit 120 and second qubit 130 in a balanced bridge topology via first reactive devices 240 and second reactive devices 250, respectively.

By connecting first qubit 120 and second qubit 130 across JRM 110 in a balanced bridge topology, first qubit 120 and second qubit 130 remain decoupled until a bias is applied to JRM 110. Stated differently, devices 100 and/or 200 facilitate a two-qubit gate with zero quiescent coupling when no bias (e.g., charge, flux, and/or current) is applied to JRM 110. Of note, the zero quiescent coupling provided by embodiments of the present disclosure is agnostic to the detuning between the qubits being coupled.

One aspect of the present disclosure that facilitates such zero quiescent coupling is that the respective critical currents of the four JJs 112, 114, 116, and 118 forming JRM 110 are nominally equivalent. Moreover, by having nominally equivalent critical currents, the respective Josephson inductances of the four JJs 112, 114, 116, and 118 are also nominally equivalent. As an example, oscillations of first qubit 120 in FIG. 1 can induce equal voltages with opposite polarities on nodes 111 and 115 of JRM 110. By symmetry of the four JJs 112, 114, 116, and 118 forming JRM 110, no voltage is induced on nodes 113 and 117 of JRM 110. In this instance, nodes 113 and 117 of JRM 110 become a virtual ground. As a result of nodes 113 and 117 becoming a virtual ground, no signal is coupled from first qubit 120 to second qubit 130.

Figure 3:
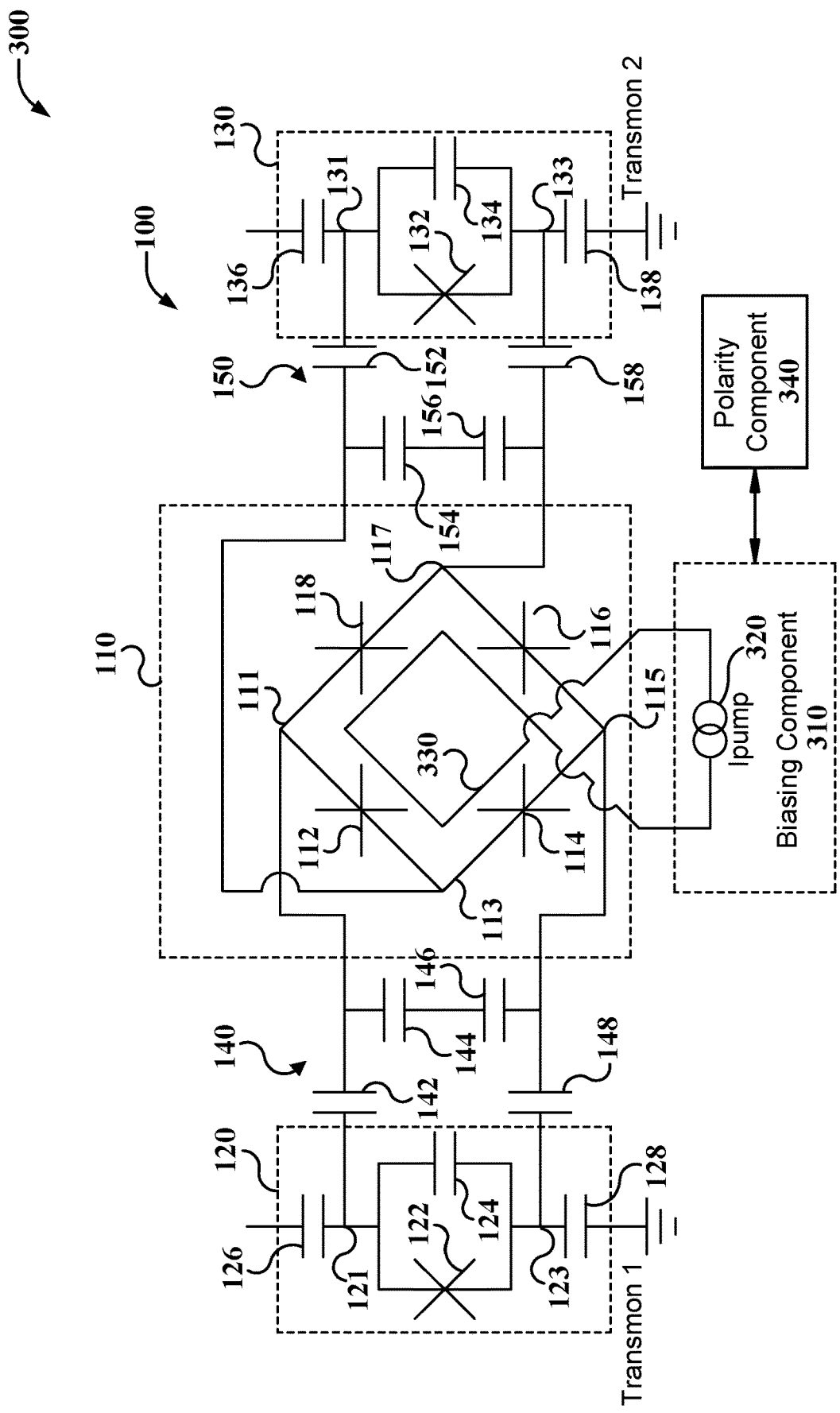
Figure 4:
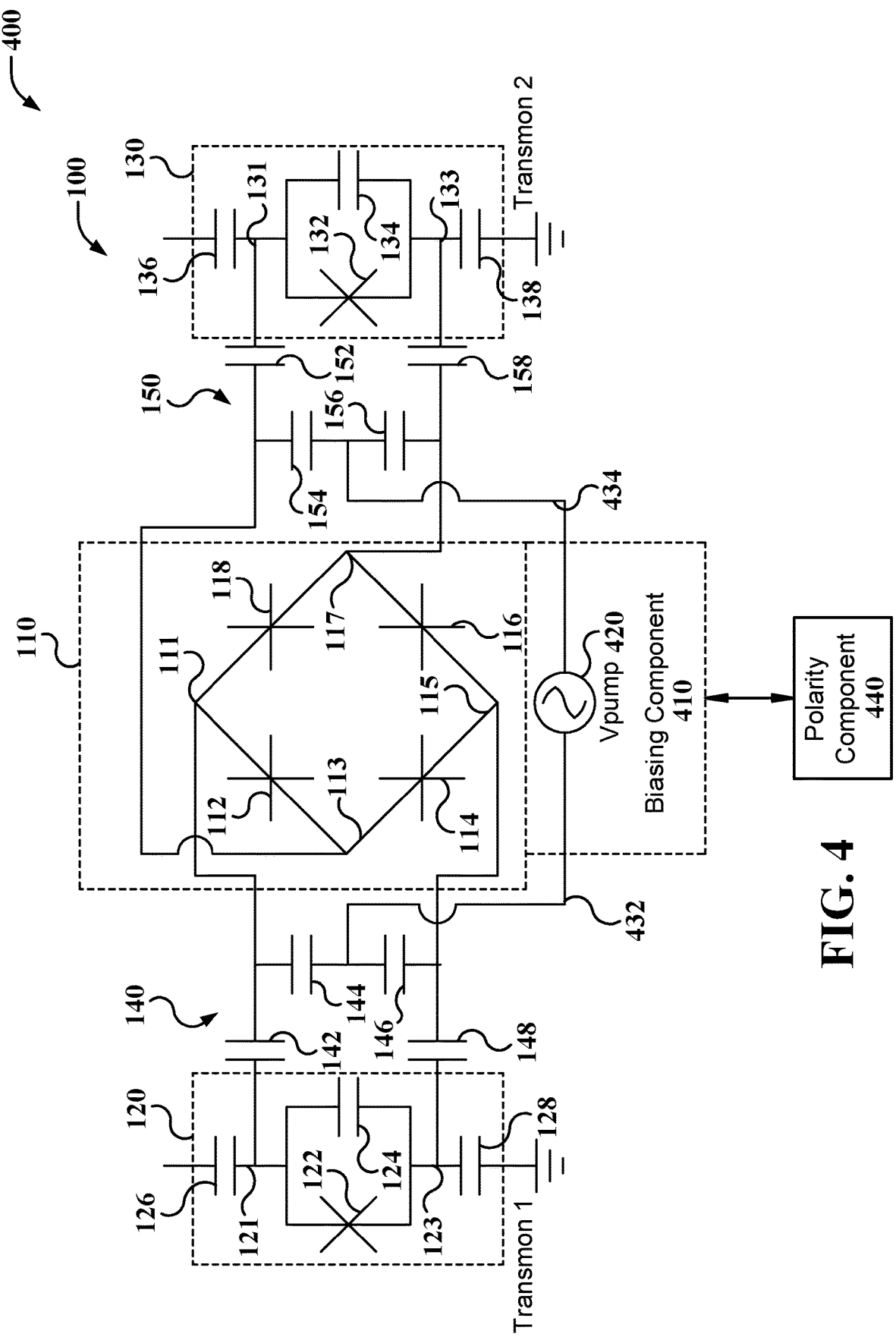

While first qubit 120 and second qubit 130 remain decoupled until a bias is applied to JRM 110, unbalancing the balanced bridge topology facilitates tuneably coupling first qubit 120 and second qubit 130. To that end, embodiments of the present disclosure utilize a biasing component that applies a bias to JRM to facilitate control of coupling between first qubit 120 and second qubit 130. FIGS. 3-4 illustrate example biasing components that can be implemented in accordance with embodiments of the present disclosure to facilitate tuneably coupling neighboring qubits.

FIG. 3 illustrates a circuit schematic of another example, non-limiting device 300 that can facilitate a quantum gate between qubits using JRM, in accordance with one or more embodiments described herein. As illustrated by FIG. 3, device 300 comprises a biasing component 310 for applying a bias signal to device 100. In FIG. 3, bias component 310 includes a current source 320 and a flux bias line 330 that forms a loop within JRM 110 of device 100. Current source 320 can generate a flux bias signal for application to JRM 110 via flux bias line 330. In an embodiment, current source 320 can generate a flux bias signal having a tunable amplitude. Application of a flux bias signal to JRM 110 via flux bias line 330 drives current equally through the four JJs 112, 114, 116, and 118 forming JRM 110.

In an embodiment, biasing component 310 applies a direct current (DC) flux bias signal to JRM 110. In this embodiment, application of the DC flux bias signal to JRM 110 modulates the respective critical currents of the four JJs 112, 114, 116, and 118 forming JRM 110. By modulating the respective critical currents, the respective inductances of the four JJs 112, 114, 116, and 118 forming JRM 110 are also modulated. Such modulation breaks the symmetry of JRM 110 by breaking an inductance match between nodes of JRM 110 (e.g., nodes 111, 113, 115, and 117). Breaking the symmetry of JRM 110 unbalances the balanced bridge topology, which facilitates providing tunable coupling between first qubit 120 and second qubit 130.

In embodiments where first qubit 120 and second qubit 130 are degenerate qubits, application of the DC flux bias signal to JRM 110 drives an excitation swap between first qubit 120 and second qubit 130. For example, application of the DC flux bias signal to JRM 110 can drive an XX like SWAP interaction between first qubit 120 and second qubit 130. In embodiments where first qubit 120 and second qubit 130 are non-degenerate qubits, application of the DC flux bias signal to JRM 110 drives a ZZ interaction between first qubit 120 and second qubit 130.

In an embodiment, biasing component 310 applies a radio frequency (RF) flux bias signal to JRM 110. In an embodiment, the RF flux bias signal comprises a difference frequency defined by respective frequencies of first qubit 120 and second qubit 130. For example, the difference frequency is defined by respective resonance frequencies of first qubit 120 and second qubit 130. In an embodiment where first qubit 120 and second qubit 130 are non-degenerate qubits, application of the RF flux bias signal to JRM 110 drives parametric conversion between first qubit 120 and second qubit 130. In an embodiment where first qubit 120 and second qubit 130 are non-degenerate qubits, application of the RF flux bias signal to JRM 110 drives 3-wave mixing action in JRM 110 and implements excitation SWAPs between first qubit 120 and second qubit 130.

In an embodiment, device 300 further comprises a polarity component 340 that can control polarity of coupling between first qubit 120 and second qubit 130. Polarity component 340 controls the polarity of that coupling by adjusting polarity of a flux bias signal applied to JRM 110. As an example, application of a flux bias signal to JRM 110 implements coupling between first qubit 120 and second qubit 130. Because JJs (e.g., the four JJs 112, 114, 116, and 118 forming JRM 110) are non-linear inductors, currents induced by each qubit (i.e., first qubit 120 and second qubit 130) that flow in the same direction within JRM 110 as the flux bias signal experience a higher inductance than induced currents flowing counter to the flux bias signal.

As a result, polarity component 340 can control the polarity of coupling between first qubit 120 and second qubit 130 by controlling the polarity of flux bias signal generated by biasing component 330. In particular, excitations of each qubit can be coupled to each other with positive polarity when a flux bias signal in a first direction (or polarity) is applied to JRM 110. Alternatively, excitations of each qubit can be coupled to each other with negative polarity when a flux bias signal in a second direction (or polarity) opposing the first direction is applied to JRM 110. This aspect of the present disclosure is discussed in greater detail below with respect to FIGS. 6-7.

FIG. 4 illustrates a circuit schematic of another example, non-limiting device 400 that can facilitate a quantum gate between qubits using JRM, in accordance with one or more embodiments described herein. As illustrated by FIG. 4, device 400 comprises a biasing component 410 for applying a bias signal to device 100. In FIG. 4, bias component 410 includes a voltage source 420 and a pair of charge bias lines (i.e., charge bias lines 432 and 434). Voltage source 410 can generate a charge bias signal for application to JRM 110 via charge bias lines 432 and 434. In an embodiment, voltage source 410 can generate a charge bias signal having a tunable amplitude and a tunable frequency. In an embodiment, application of a charge bias signal to JRM 110 via charge bias lines 432 and 434 drives a Z mode of JRM 110 (e.g., the Z mode of FIG. 5C).

In an embodiment, biasing component 410 applies an RF charge bias signal to JRM 110. In an embodiment, the RF charge bias signal comprises a difference frequency defined by respective frequencies of first qubit 120 and second qubit 130. For example, the difference frequency is defined by respective resonance frequencies of first qubit 120 and second qubit 130. In an embodiment where first qubit 120 and second qubit 130 are non-degenerate qubits, application of the RF charge bias signal to JRM 110 drives parametric conversion between first qubit 120 and second qubit 130. In an embodiment where first qubit 120 and second qubit 130 are non-degenerate qubits, application of the RF charge bias signal to JRM 110 drives 3-wave mixing action in JRM 110 and implements excitation SWAPs between first qubit 120 and second qubit 130.

Devices 100, 200, 300 and/or 400 can comprise a semiconducting and/or a superconducting device that can be implemented in a quantum device. Examples of suitable quantum devices in which devices 100, 200, 300, and/or 400 can be implemented include, but are not limited to: quantum hardware, a quantum processor, a quantum computer, and the like.

Fabrication of the various embodiments of the subject disclosure described herein and/or illustrated in the figures (e.g., devices 100, 200, 300, and/or 400) can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the various embodiments of the subject disclosure described herein and/or illustrated in the figures (e.g., devices 100, 200, 300, and/or 400) can be fabricated on a substrate (e.g., a silicon (Si) substrate, etc.) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

The various embodiments of the subject disclosure described herein and/or illustrated in the figures (e.g., devices 100, 200, 300, and/or 400) can be fabricated using various materials. For example, the various embodiments of the subject disclosure described herein and/or illustrated in the figures (e.g., devices 100, 200, 300, and/or 400) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

Figure 6:
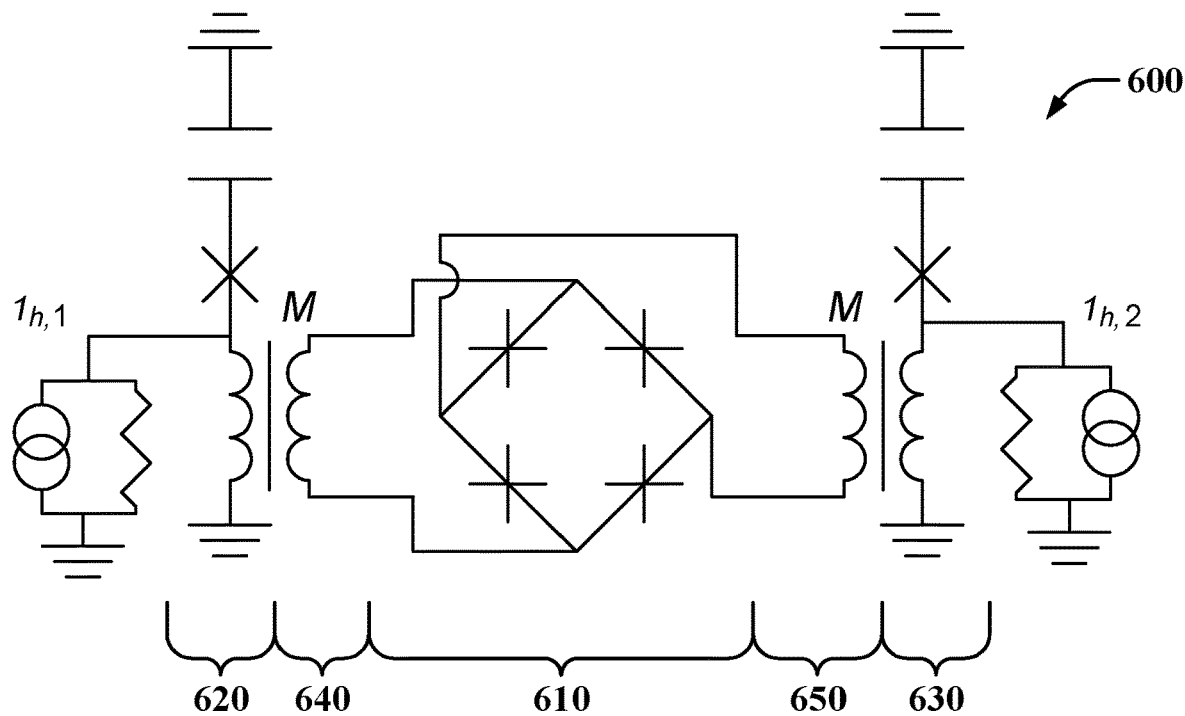
FIG. 6 illustrates a circuit schematic of an example, non-limiting reduced coupling circuit to utilize in a simulation, in accordance with one or more embodiments described herein.

FIG. 6 illustrates a circuit schematic of an example, non-limiting reduced coupling circuit 600 to utilize in a simulation, in accordance with one or more embodiments described herein. As illustrated by FIG. 6, reduced coupling circuit 600 provides an example in which neighboring qubits are mutually coupled to a JRM to form a balanced bridge topology. In this example, JRM 610 is operatively coupled to first qubit 620 and second qubit 630 in a balanced bridge topology via first inductive device 640 and second inductive device 650, respectively.

Figure 7:
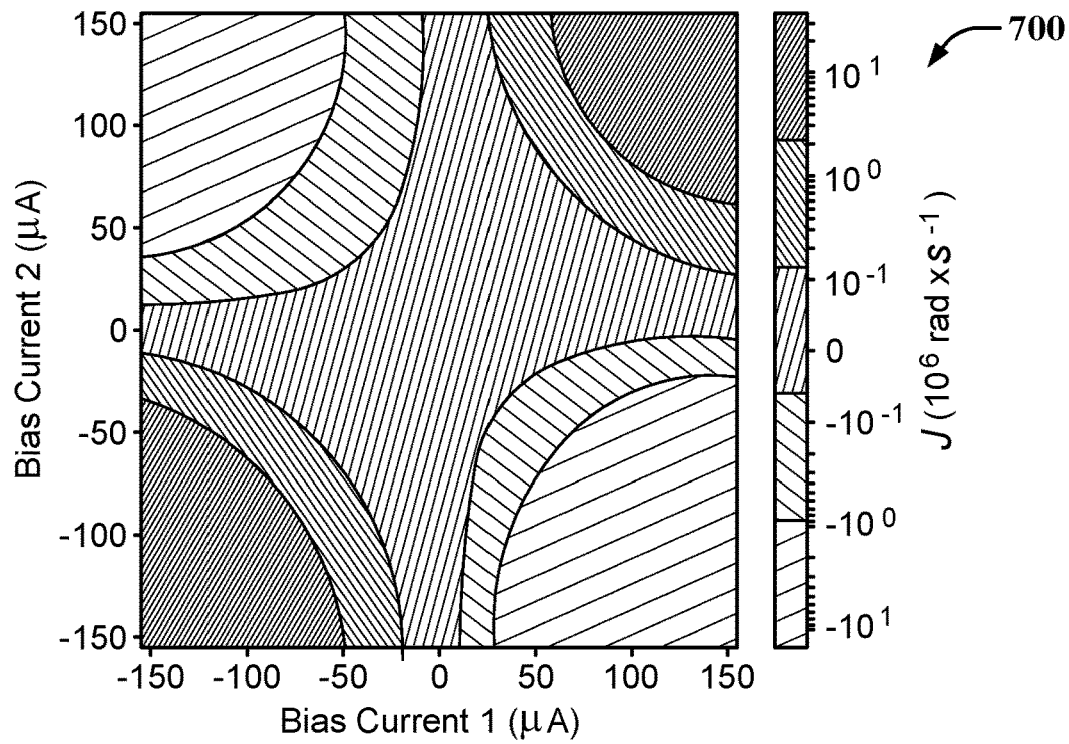
FIG. 7 illustrates a graph depicting WRSpice simulation results of the circuit of FIG. 6.

FIG. 7 illustrates a graph 700 depicting WRSpice simulation results of the circuit of FIG. 6. In FIG. 7, graph 700 is a false-color graph depicting results yielded from simulating reduced coupling circuit 600 that can be plotted as: second qubit bias current that is denoted as Bias Current 2 and expressed in microamps (µA) in the Y-axis (e.g., the vertical axis of graph 700); first qubit bias current that is denoted as Bias Current 1 and expressed in microamps (µA) in the X-axis (e.g., the horizontal axis of graph 700); and resultant two-qubit coupling between first qubit 620 and second qubit 630 represented by varying colors in the Z-axis (e.g., the axis of graph 700 extending into and out of the page) that correspond with radians per second ranging from approximately $-2*e^7$ radians per second to $2*e^7$ radians per second as illustrated by the J legend depicted in FIG. 7.

In an example embodiment, to produce graph 700, the coupler is simulated with the qubits being replaced by RF tone sources with a simulated scattering matrix. In this example, the transmission scattering matrix element S21 is calculated in the simulation and then converted to an impedance matrix from which the coupling strength J is calculated. In this example, the simulation using the following parameters: respective mutual inductances (M) between each qubit and the JRM=160 picohenries (pH); frequency (e.g., resonant frequency) $\omega_{qb,1}$ of first of first qubit $620=2\pi\times 5$ GHz; and frequency (e.g., resonant frequency) $\omega_{qb,2}$ of first of second qubit $630=2\pi\times 5$ GHz.

As illustrated by graph 700, the resultant two-qubit coupling, J, is relatively low (e.g., ~0 Hz) for a relatively large swath of bias currents. This result demonstrates that reduced coupling circuit 600 can be implement a coupling device that is largely insensitive to flux noise. Graph 700 further illustrates that polarity of the resultant two-qubit coupling, J, can be tuned from positive to negative by adjusting polarity of the respective bias currents. This result demonstrates that a maximum two-qubit coupling, J, of greater than 2 megahertz (MHz) can be achieved by adjusting the polarity of the respective bias currents.

Figure 8:
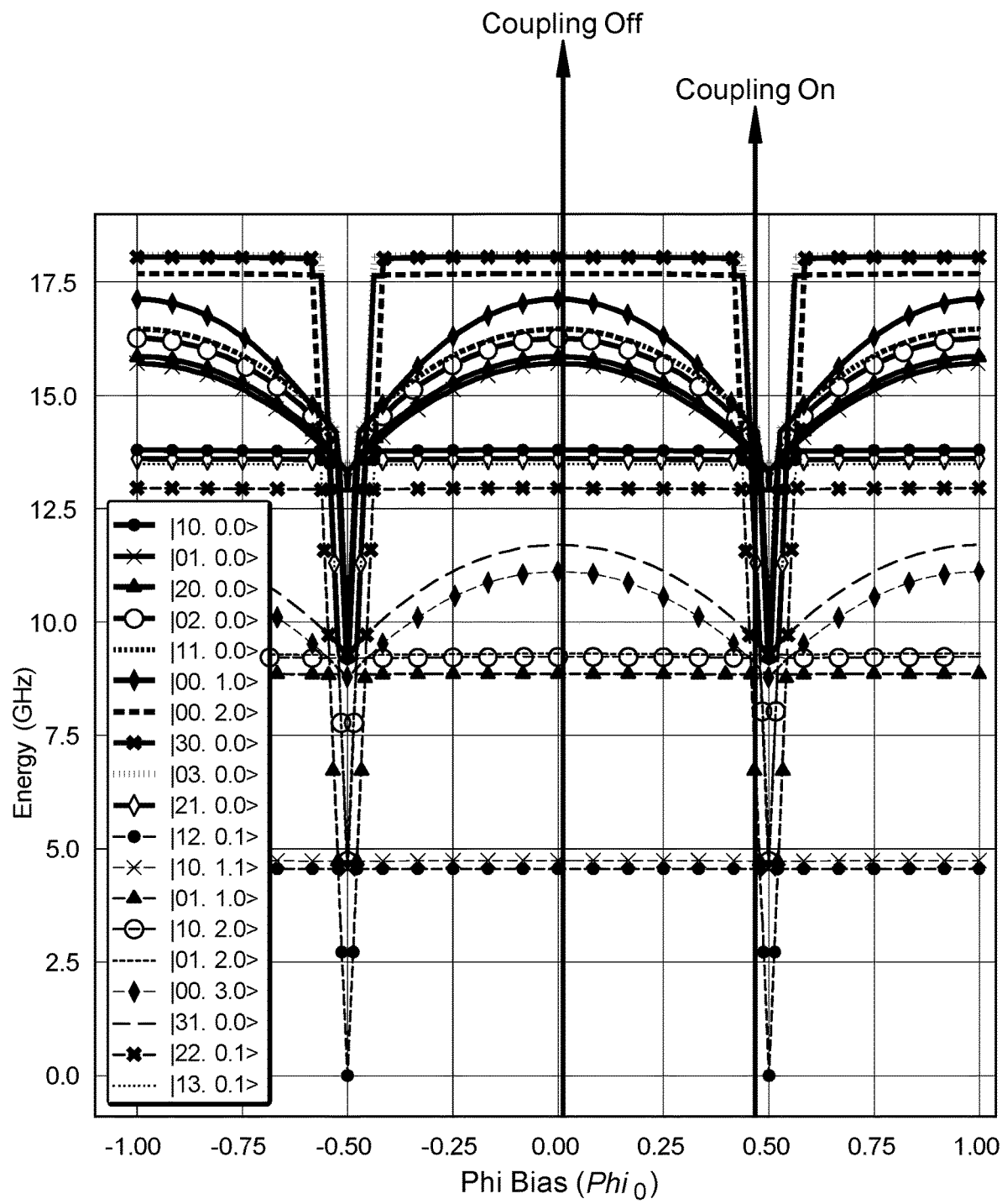
FIG. 8 illustrates an example, non-limiting graph depicting device energy levels vs magnetic flux bias (in units of the magnetic flux quantum), in accordance with one or more embodiments described herein.

FIG. 8 illustrates an example, non-limiting graph 800 depicting device energy levels vs magnetic flux bias, in accordance with one or more embodiments described herein. In FIG. 8, energy states are labelled according to occupations at 0 Flux bias, as illustrated by the depicted legend.

Figure 9:
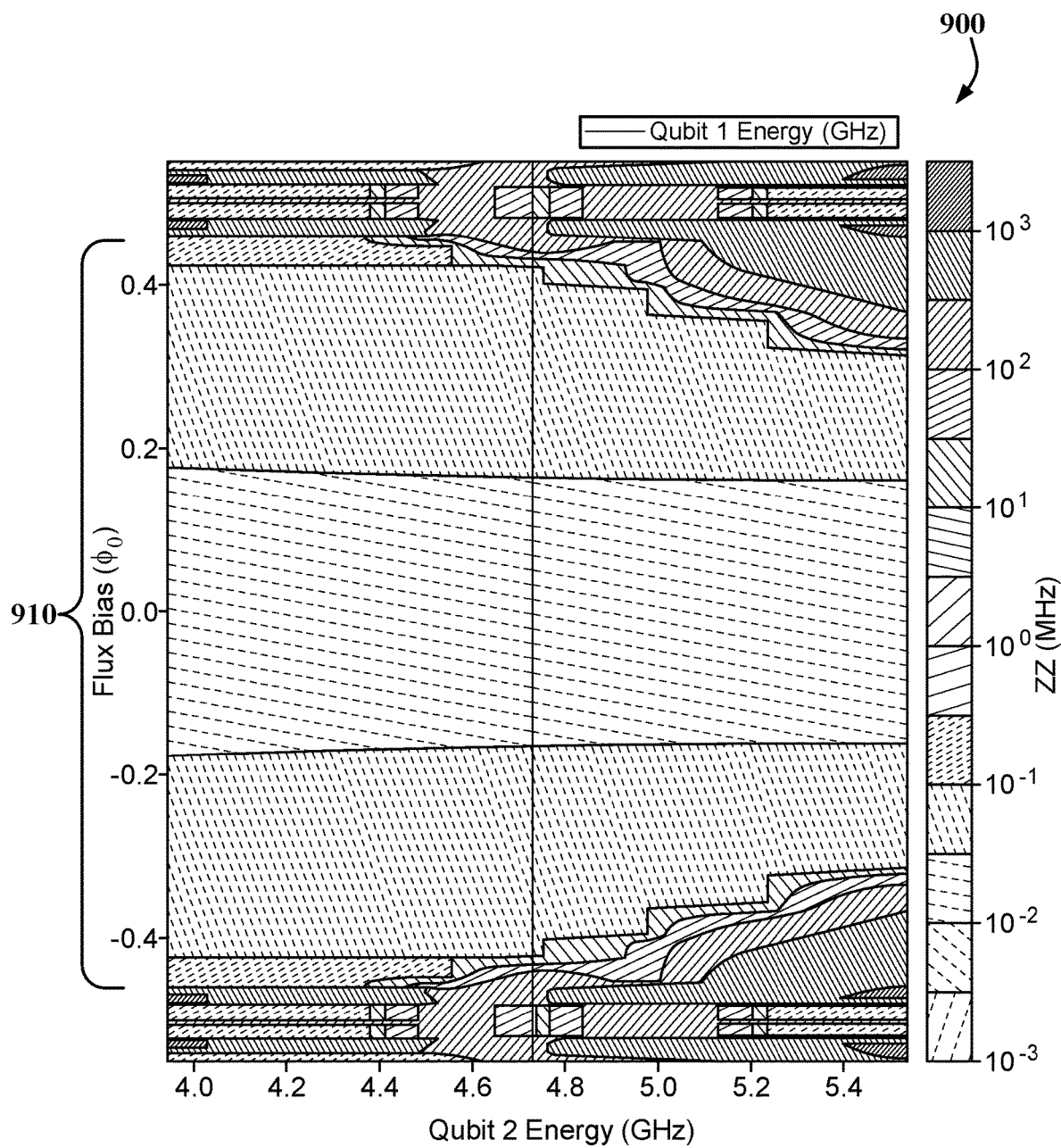
FIG. 9 illustrates an example, non-limiting false color graph depicting ZZ coupling versus flux bias and second qubit frequency, in accordance with one or more embodiments described herein.

FIG. 9 illustrates an example, non-limiting false color graph 900 depicting ZZ coupling versus flux bias and second qubit 120 frequency, in accordance with one or more embodiments described herein. As illustrated by graph 900, ZZ coupling is relatively low (e.g., ~10 kHz) for detuning in a region 910 corresponding to 0 flux bias. Graph 900 further illustrates that ZZ coupling can be relatively high (e.g., >1 GHz) external to region 910.

Figure 10:
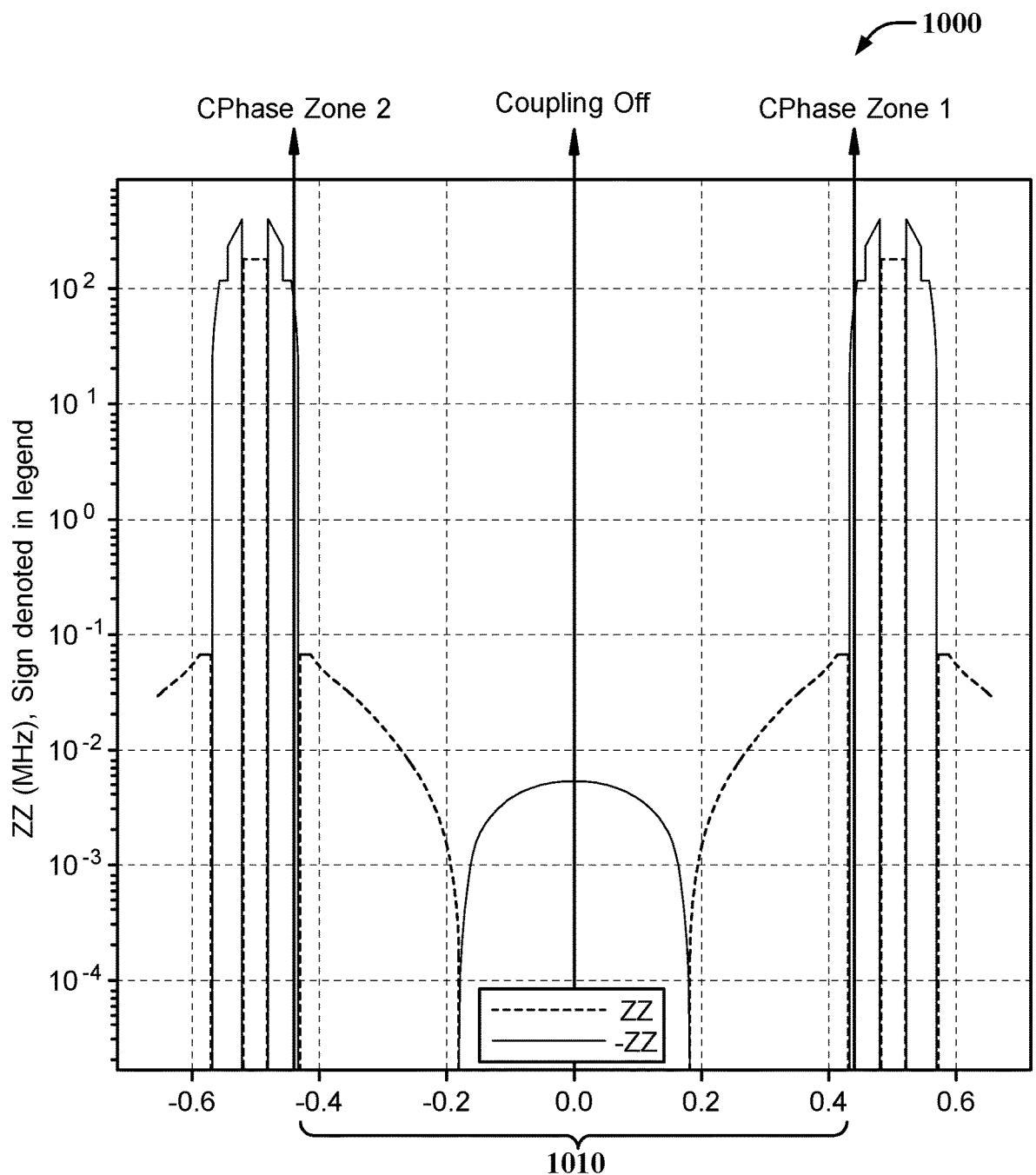
FIG. 10 illustrates an example, non-limiting graph depicting ZZ coupling versus magnetic flux bias (in units of the magnetic flux quantum), in accordance with one or more embodiments described herein.

FIG. 10 illustrates an example, non-limiting graph 1000 depicting ZZ coupling versus magnetic flux bias, in accordance with one or more embodiments described herein. As illustrated by graph 1000, ZZ coupling can be substantially zero in a stable off region 1010 corresponding to 0 flux bias. In an embodiment, the stable off region 1010 corresponds to an off state that can be set by changing the magnetic flux bias. Graph 1000 further illustrates that ZZ coupling can be relatively large (e.g., of order several MHz or more) in an on state external to region 1010.

Figure 11:
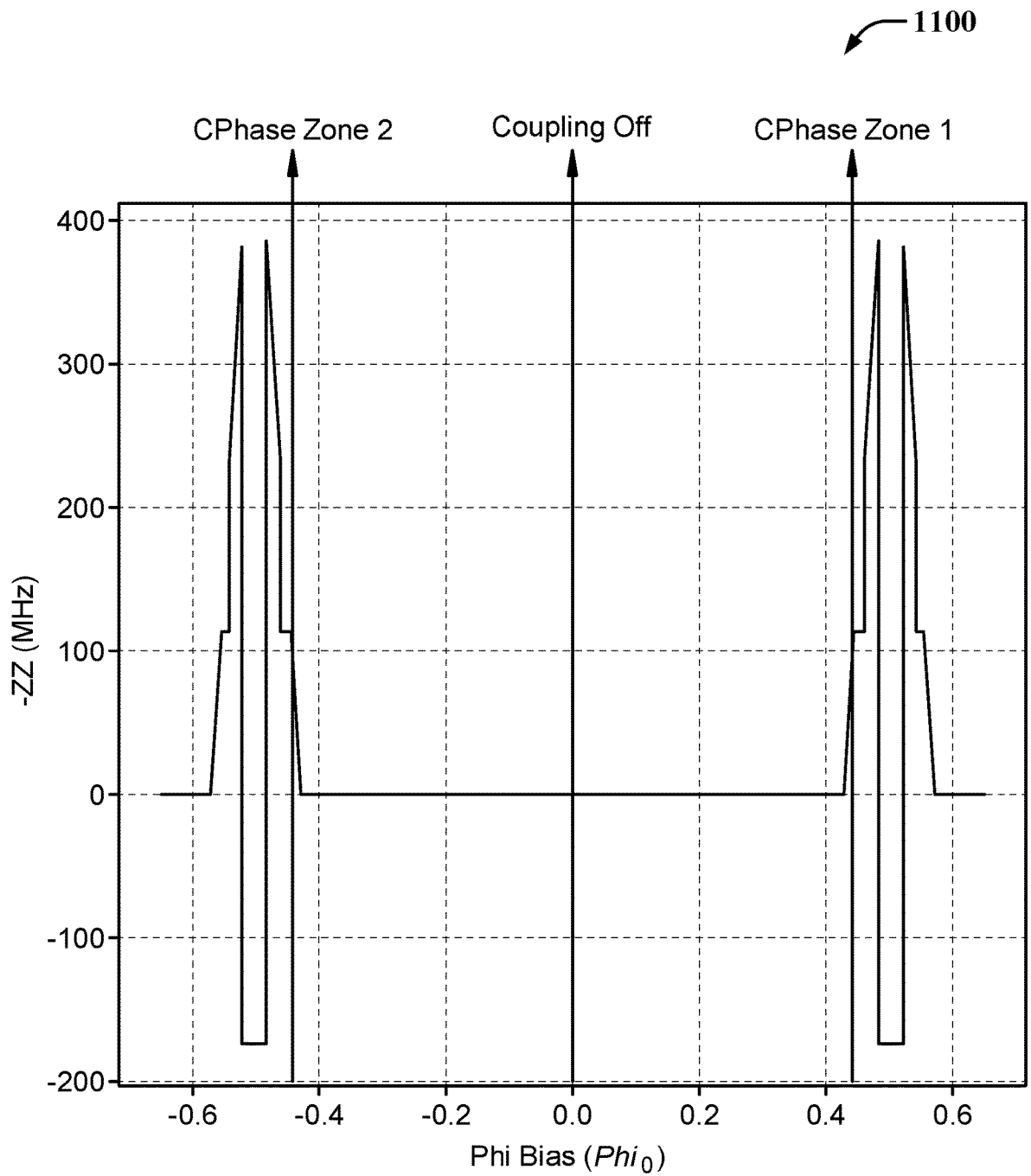
FIG. 11 illustrates an example, non-limiting graph depicting −ZZ coupling versus magnetic flux bias (in units of the magnetic flux quantum), in accordance with one or more embodiments described herein.

FIG. 11 illustrates an example, non-limiting graph 1100 depicting –ZZ coupling versus magnetic flux bias in units of the magnetic flux quantum, in accordance with one or more embodiments described herein.

Figure 12:
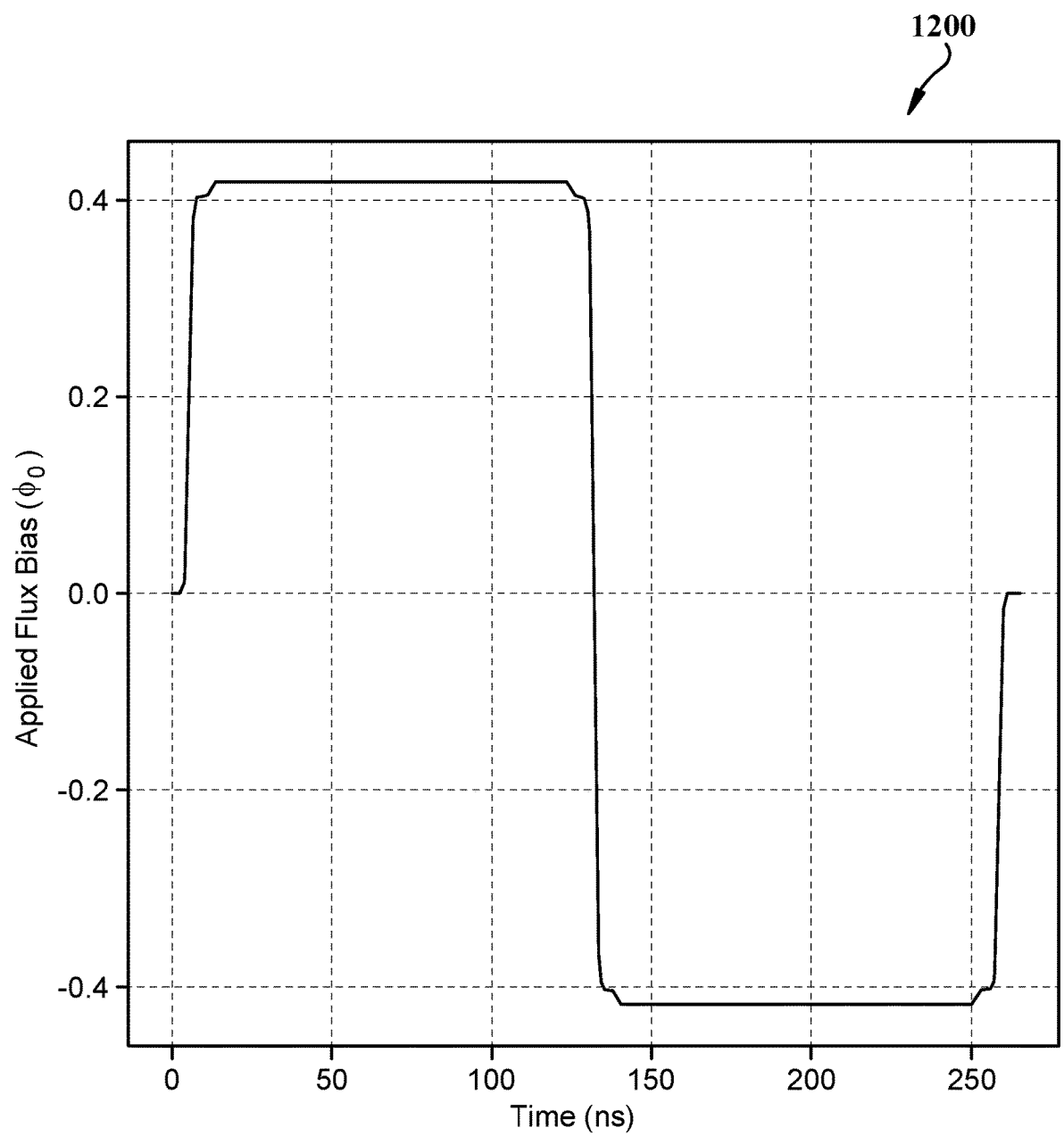
FIG. 12 illustrates an example, non-limiting graph depicting applied flux bias versus time to enact a two qubit phase gate, in accordance with one or more embodiments described herein.

FIG. 12 illustrates an example, non-limiting graph 1200 depicting applied flux bias versus time to enact a two-qubit controlled phase gate, in accordance with one or more embodiments described herein.

Figure 13:
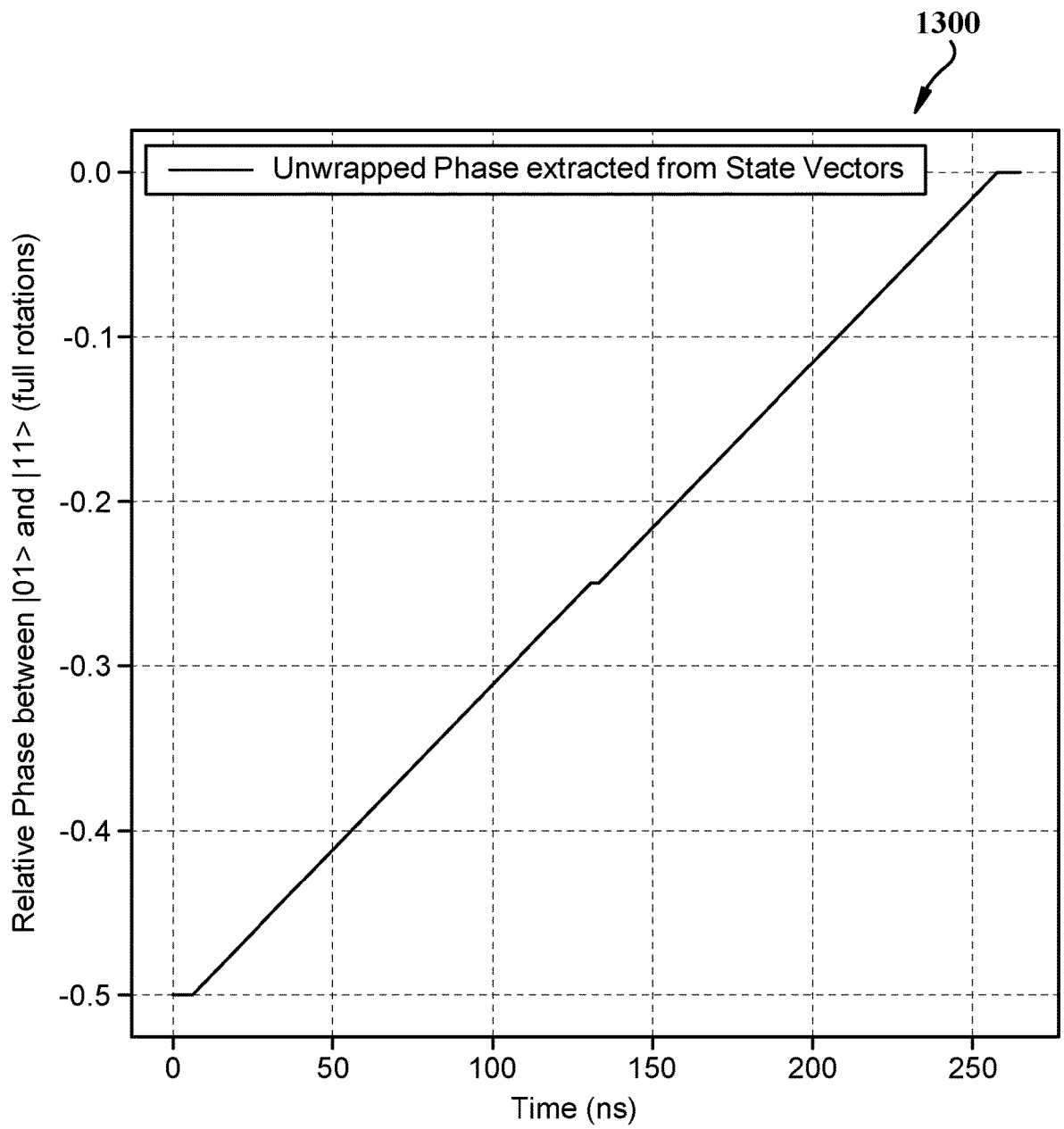
FIG. 13 illustrates an example, non-limiting graph depicting a relative phase difference between |10> and |11> quantum states versus time for the applied flux profile in FIG. 12, in accordance with one or more embodiments described herein.

FIG. 13 illustrates an example, non-limiting graph 1300 depicting the relative phase difference between |01> and |11> quantum states versus time for the applied flux profile in FIG. 12, in accordance with one or more embodiments described herein.

Figure 14:
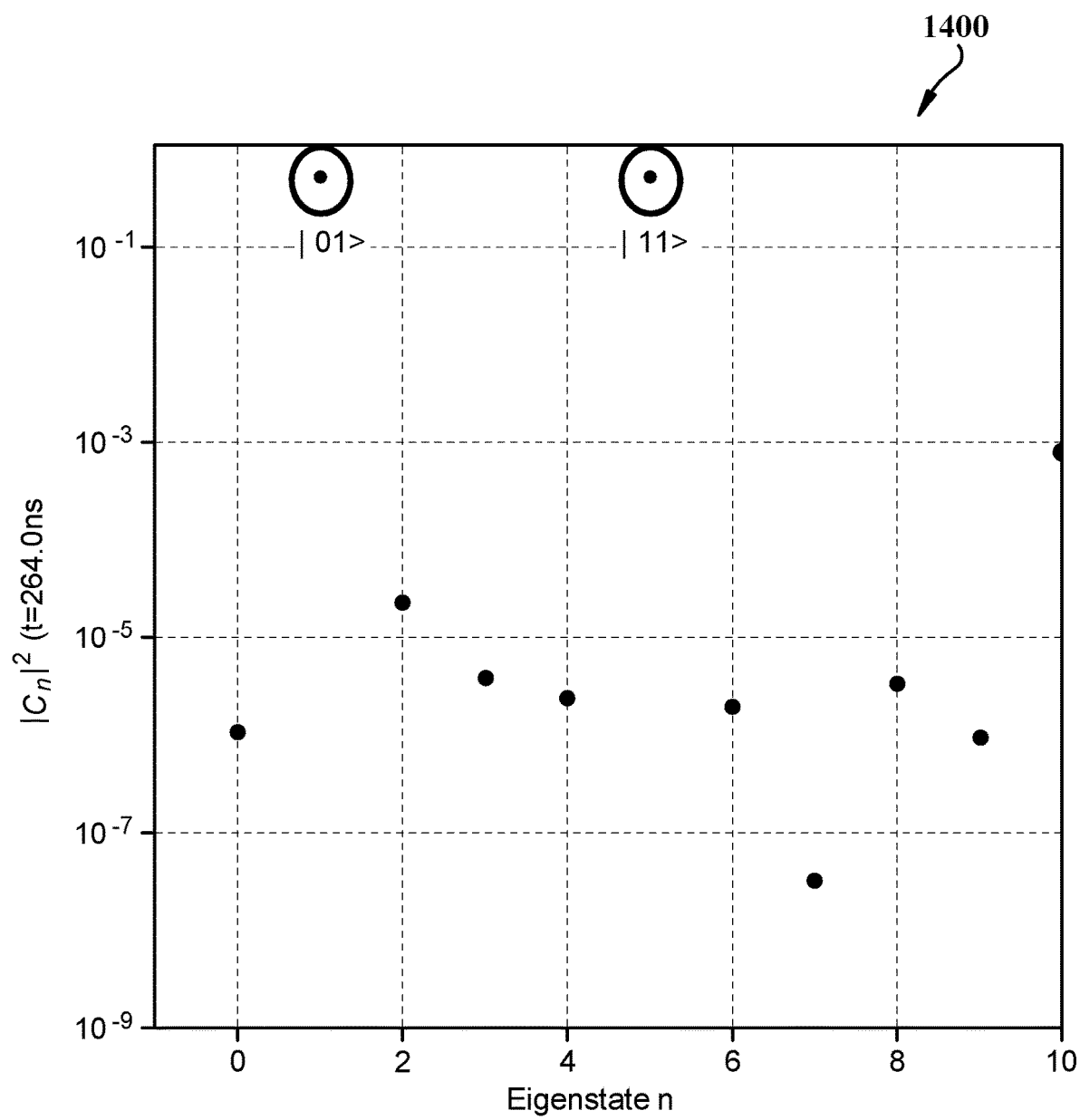
FIG. 14 illustrates an example, non-limiting graph depicting Eigenstate Occupation |Cn|^2 versus Eigenstate number n, in accordance with one or more embodiments described herein.

FIG. 14 illustrates an example, non-limiting graph 1400 depicting Eigenstate Occupation |Cn|^2 versus Eigenstate number n, in accordance with one or more embodiments described herein.

Figure 15:
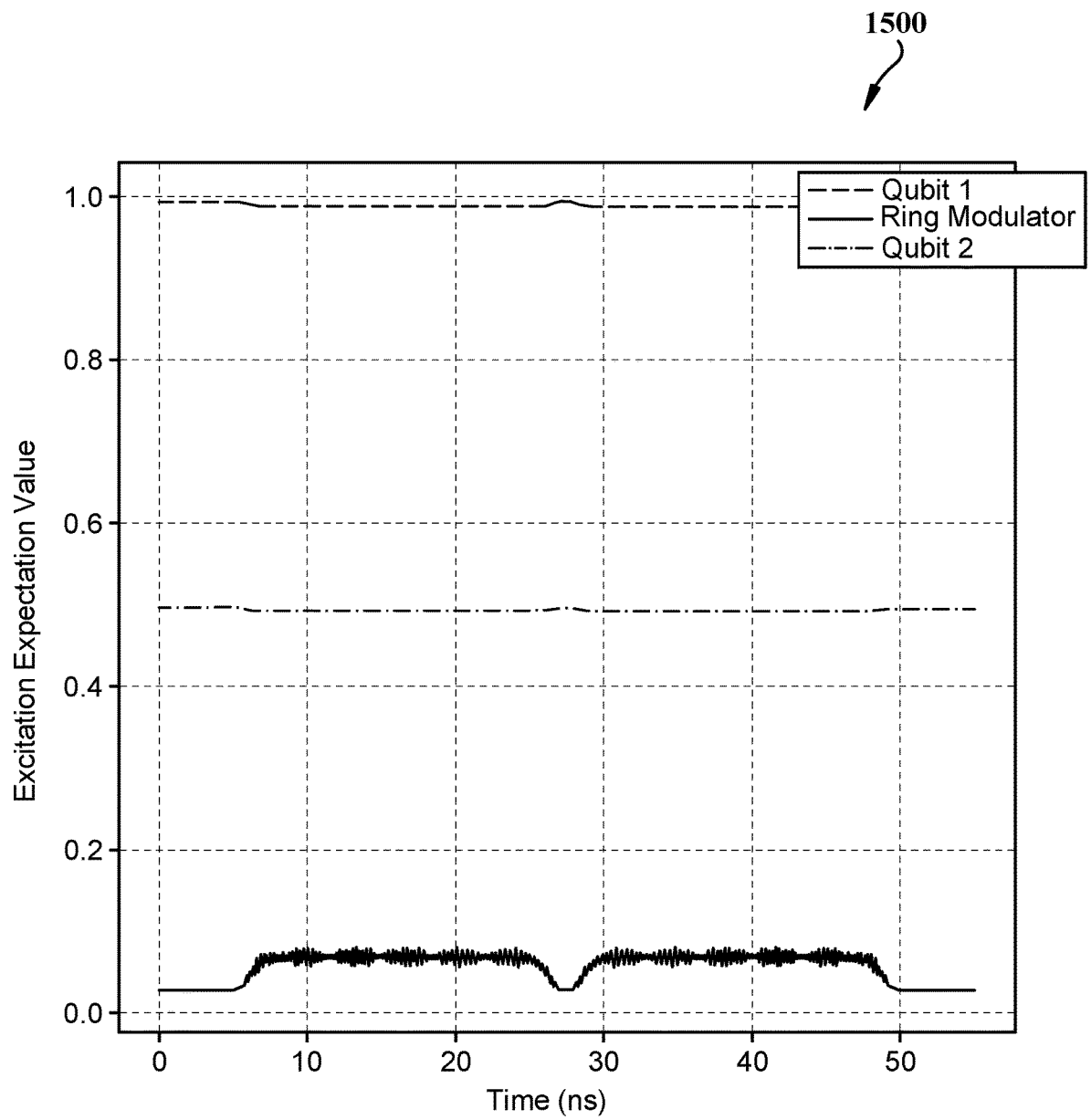
FIG. 15 illustrates an example, non-limiting graph depicting excitation expectation value for first and second qubits versus time where the first and second qubits are coupled via a ring modulator, in accordance with one or more embodiments described herein.

FIG. 15 illustrates an example, non-limiting graph 1500 depicting excitation expectation value for first and second qubits versus time where the first and second qubits are coupled via a ring modulator, in accordance with one or more embodiments described herein.

Figure 16:
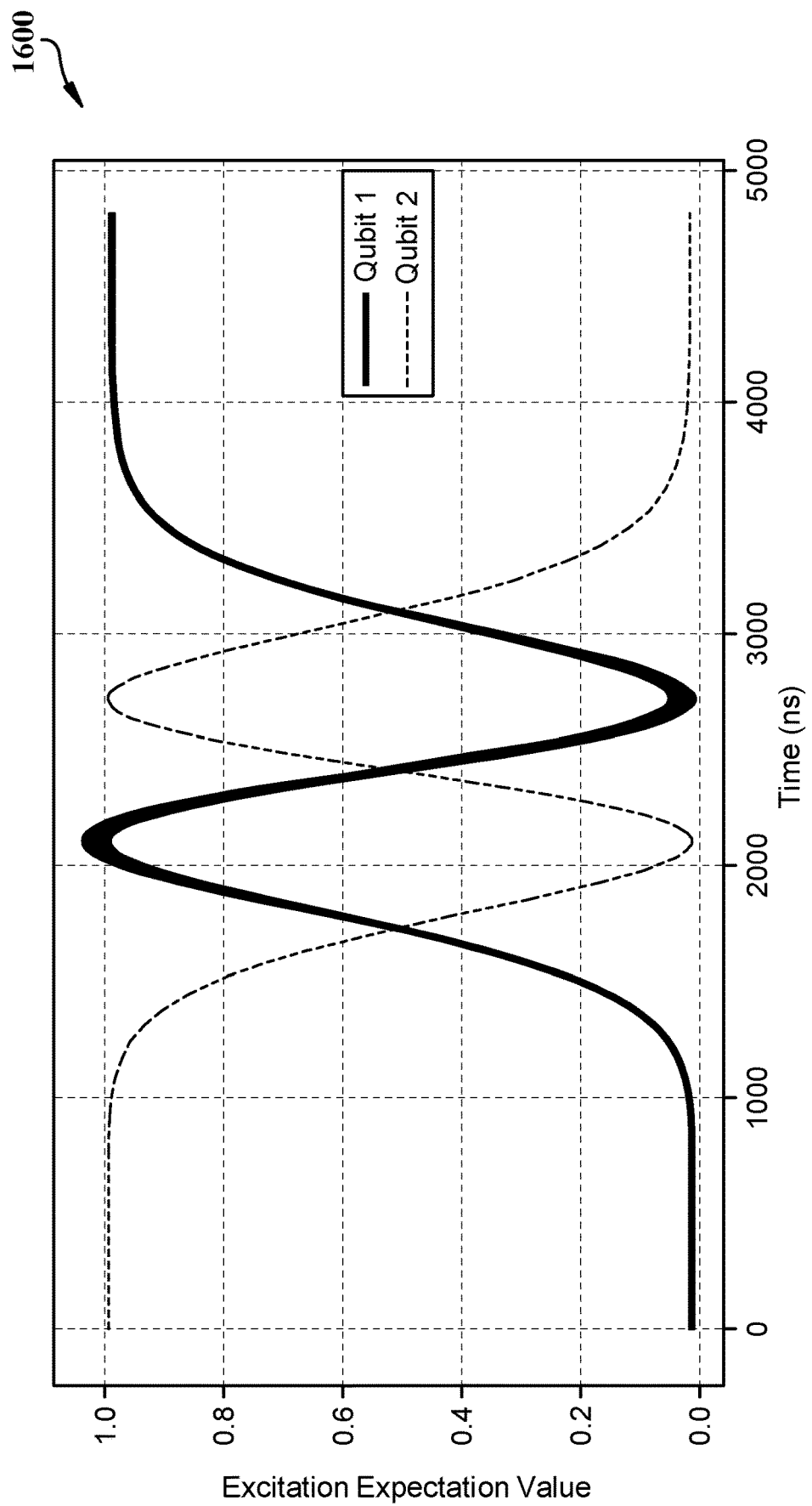
FIG. 16 illustrates an example, non-limiting graph depicting excitation expectation value for first and second qubits versus time where the first and second qubits are coupled via a JRM during a SWAP operation, in accordance with one or more embodiments described herein.

FIG. 16 illustrates an example, non-limiting graph 1600 depicting excitation expectation value for first and second qubits versus time where the first and second qubits are coupled via a JRM during a SWAP operation, in accordance with one or more embodiments described herein. In an embodiment, graph 1600 was obtained by using example device 400 of FIG. 4 to drive a parametric conversion (or swap) between first qubit 120 and second qubit 130. In this embodiment, first qubit 120 and second qubit 130 are detuned by approximately 600 MHz.

Figure 17:
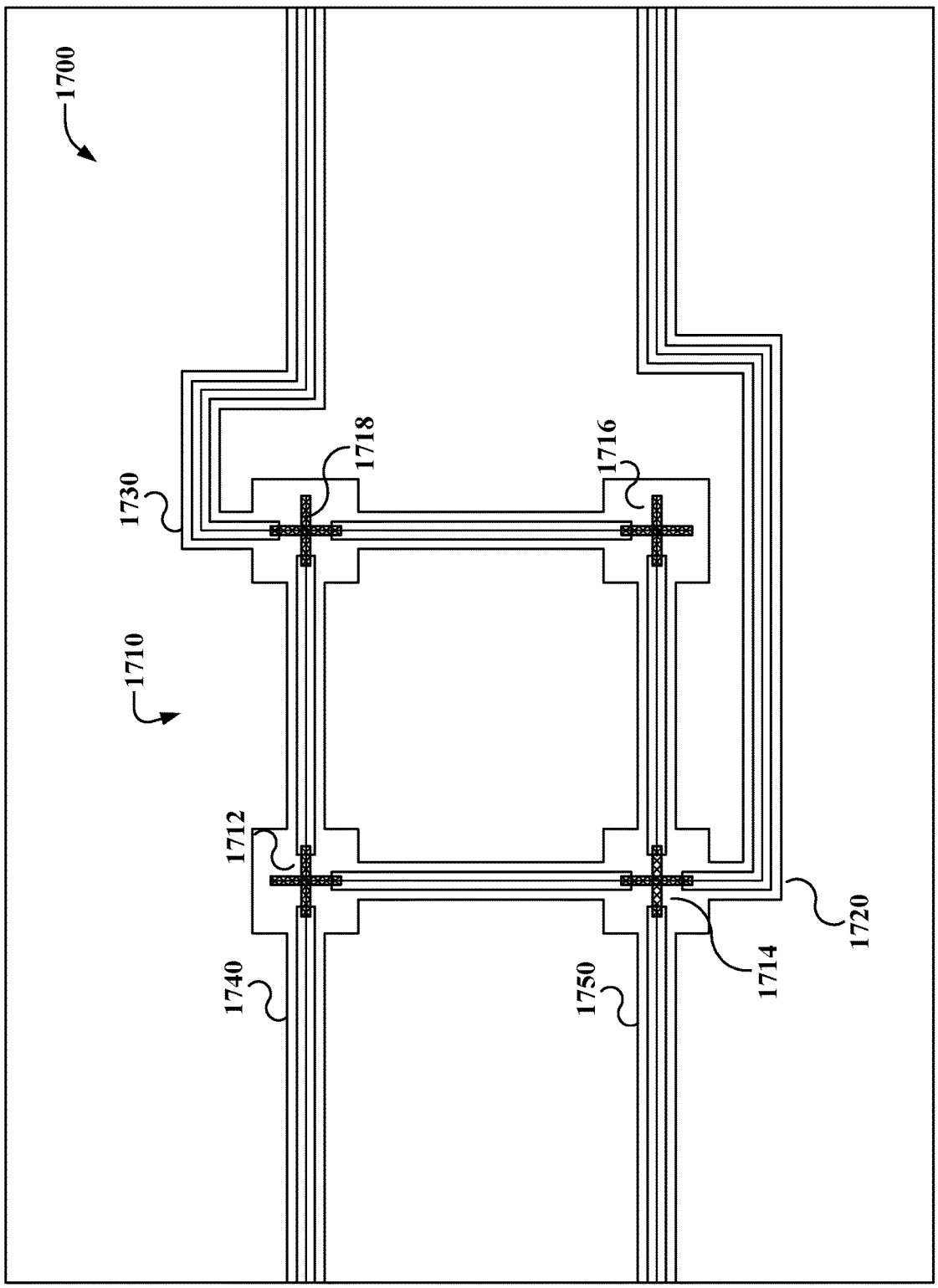
FIG. 17 illustrates a top view of an example, non-limiting device that can reduce routing complexities associated with crossover features in multi-dimensional arrays of qubits, in accordance with one or more embodiments described herein.

FIG. 17 illustrates a top view of an example, non-limiting device 1700 that can mitigate routing and/or layout complexities associated with crossover features in multi-dimensional (e.g., 2D) arrays of qubits, in accordance with one or more embodiments described herein. Crossover features, such as crossover feature 170 of FIG. 1, can induce undesired effects (e.g., crosstalk, noise, and the like) that adversely impact device operation. Such undesired effects can be mitigated by appropriately routing traces or positioning components during a design phase. However, as the scaling of quantum computing technology advances, complex multi-qubit architectures (e.g., the multi-dimensional qubit array of FIG. 18) create increasingly complex routing and layout concerns.

To mitigate such routing and/or layout complexities, example device 1700 implements Manhattan junctions that create tunnel junction geometries that also serve as crossover features. In particular, device 1700 includes a JRM 1710 comprising four JJs 1712, 1714, 1716, and 1718 that are arranged in a ring configuration. JRM 1710 further comprises first connection 1720 coupled to JJ 1714 and second connection 1730 coupled to JJ 1718. Connections 1720, 1730, 1740, and 1750 connect the JRM 1710 to either the capacitive or inductive qubit couplers.

Figure 18:
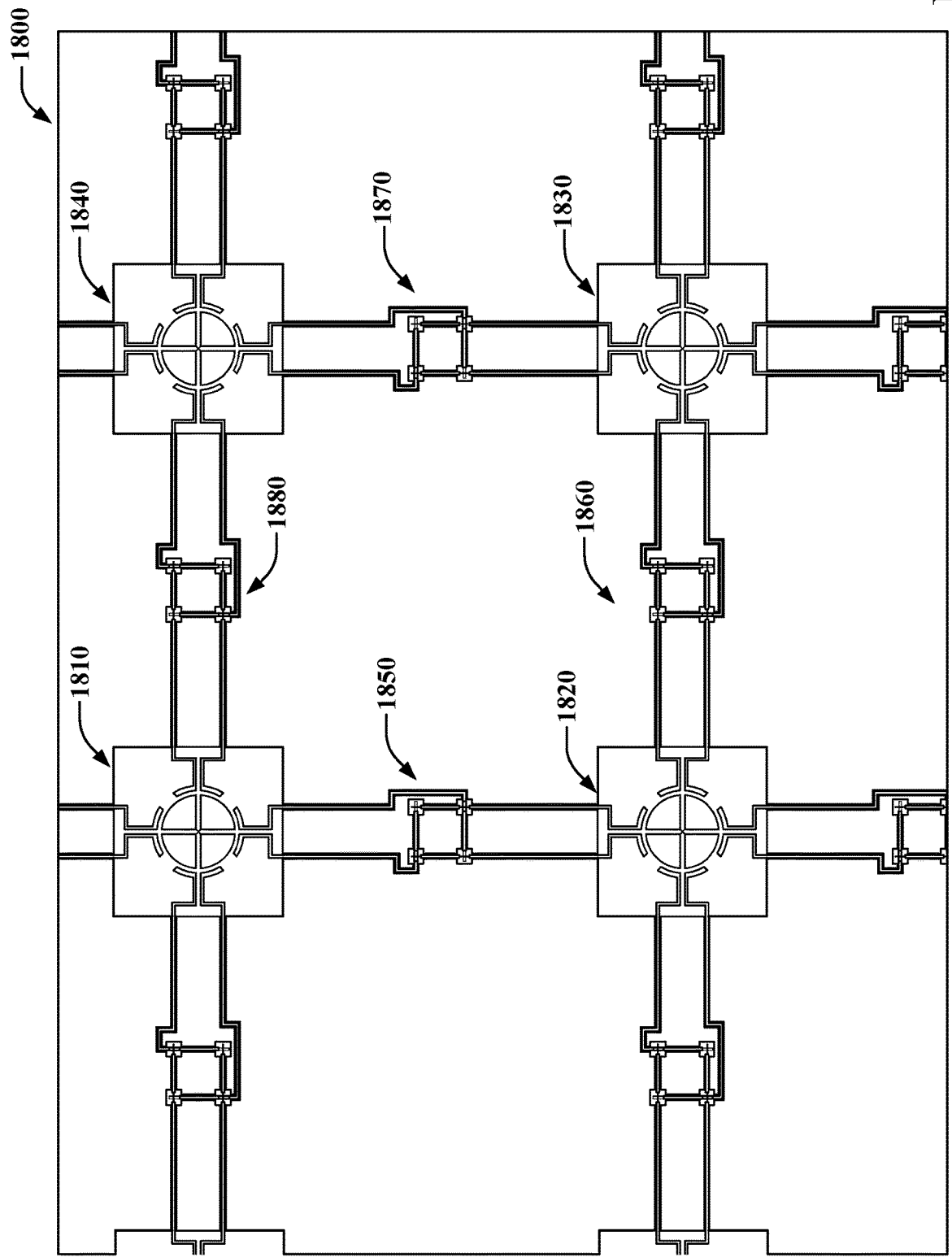
FIG. 18 illustrates a top view of an example, non-limiting device that includes a multi-dimensional qubit array, in accordance with one or more embodiments described herein.

FIG. 18 illustrates a top view of an example, non-limiting device 1800 that includes a multi-dimensional qubit array, in accordance with one or more embodiments described herein. Device 1800 includes four qubits (i.e., first qubit 1810, second qubit 1820, third qubit 1830, and fourth qubit 1840) arranged in a 2D array. In an embodiment, the four qubits of device 1800 are quadrupole qubits that can provide full 2D connectivity. In device 1800, first qubit 1810 is coupled to second qubit 1820 via JRM 1850; second qubit 1820 is coupled to third qubit 1830 via JRM 1860; third qubit 1830 is coupled to fourth qubit 1840 via JRM 1870; fourth qubit 1840 is connect to first qubit 1810 via JRM 1880. As illustrated by FIG. 18, each JRM of device 1800 includes four Manhattan junctions.

Figure 19:
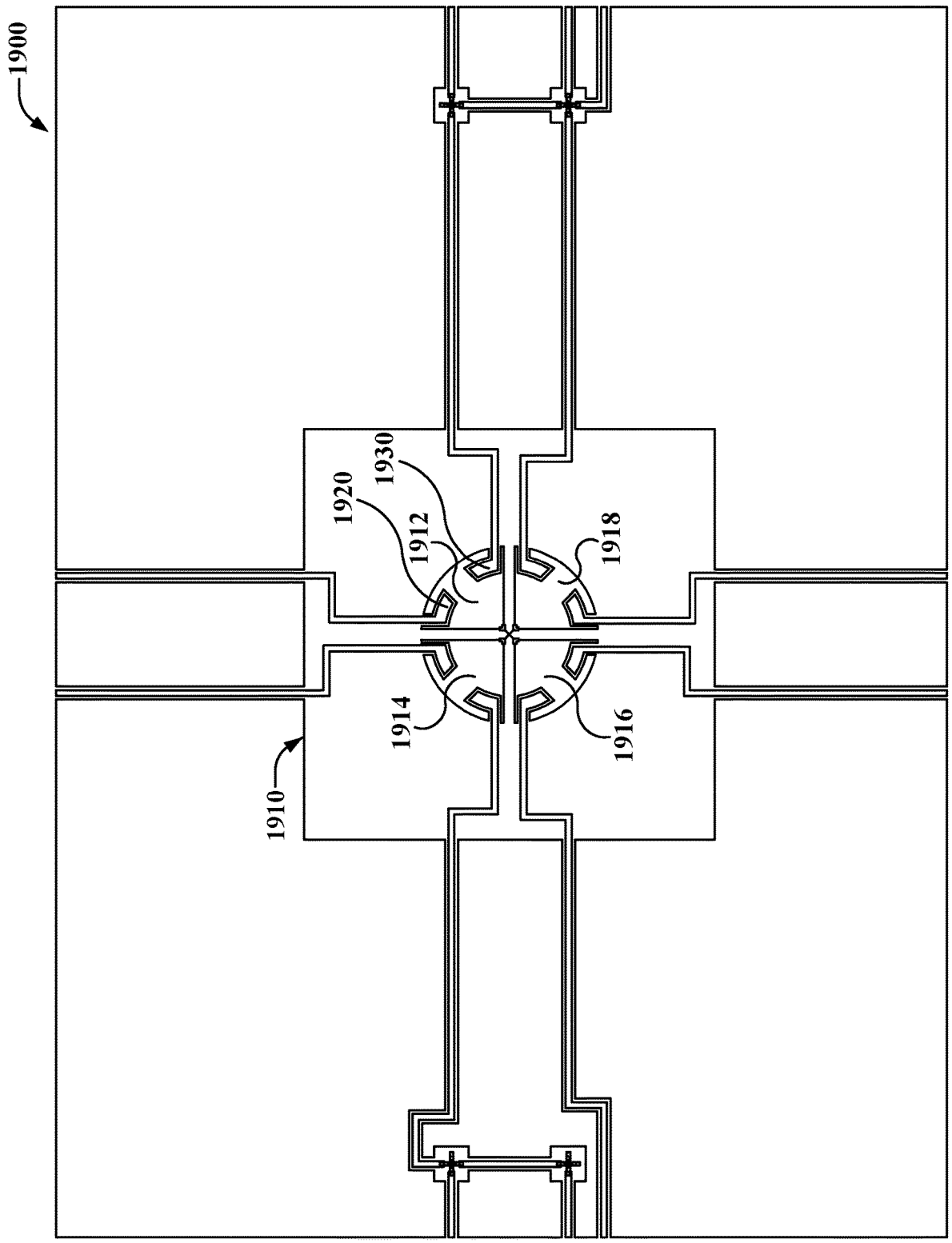
FIG. 19 illustrates a top view of an example, non-limiting device that can facilitate enhanced coupling, in accordance with one or more embodiments described herein.

FIG. 19 illustrates a top view of an example, non-limiting device 1900 that can facilitate enhanced coupling, in accordance with one or more embodiments described herein. Device 1900 includes qubit 1910 that comprises four voltage paddles or paddles (i.e., paddle 1912, paddle 1914, paddle 1916, and paddle 1918). As illustrated by FIG. 19, two capacitive devices are formed inside or within a footprint of each paddle comprising qubit 1910. For example, capacitive device 1920 and capacitive device 1930 are formed inside or within a footprint of paddle 1912.

Figure 20:
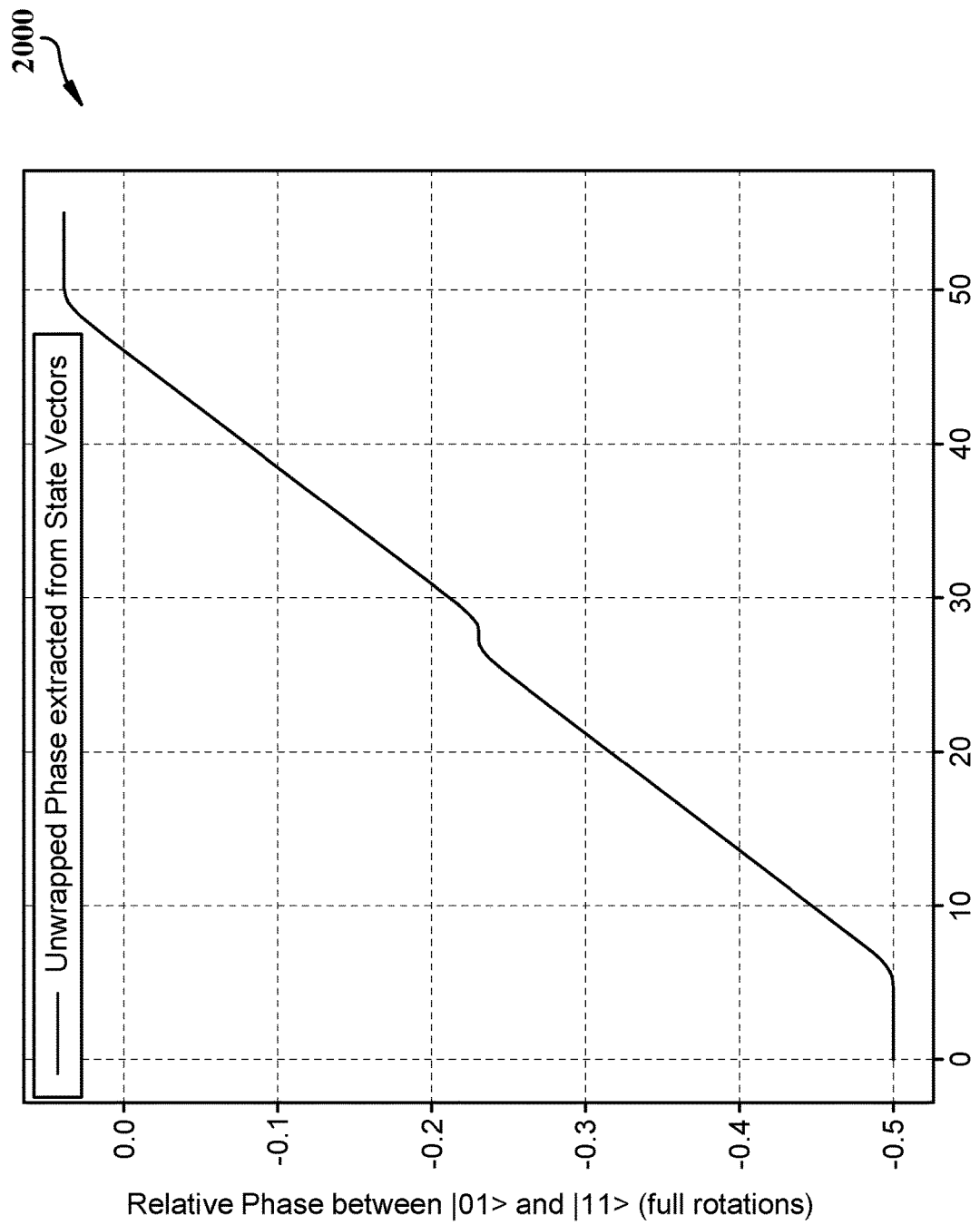
FIG. 20 illustrates an example, non-limiting graph depicting a relative phase difference between |01> and |11> quantum states versus time, in accordance with one or more embodiments described herein.
Figure 21:
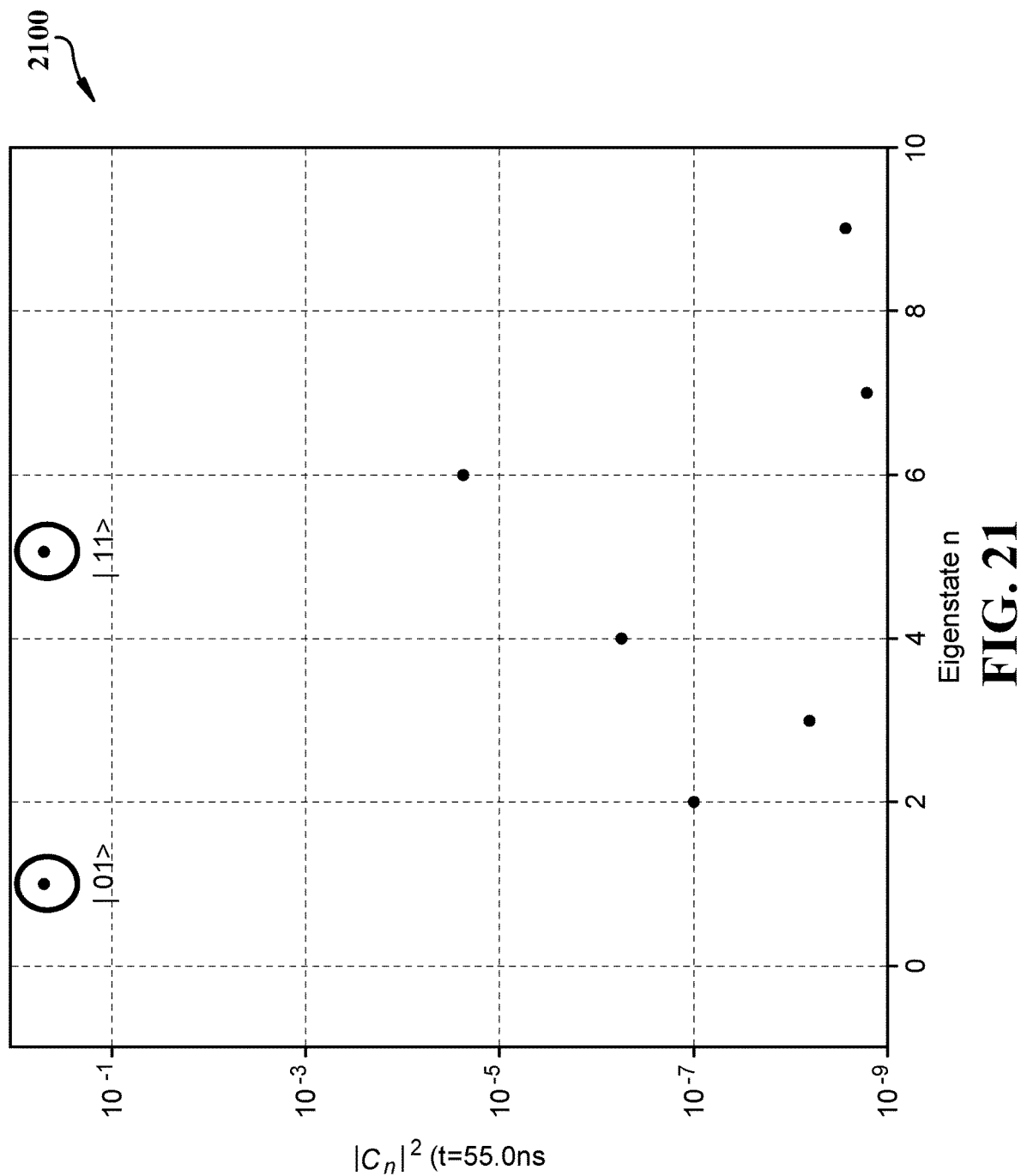
FIG. 21 illustrates an example, non-limiting graph depicting Population versus Eigenstate, in accordance with one or more embodiments described herein.
Figure 22:
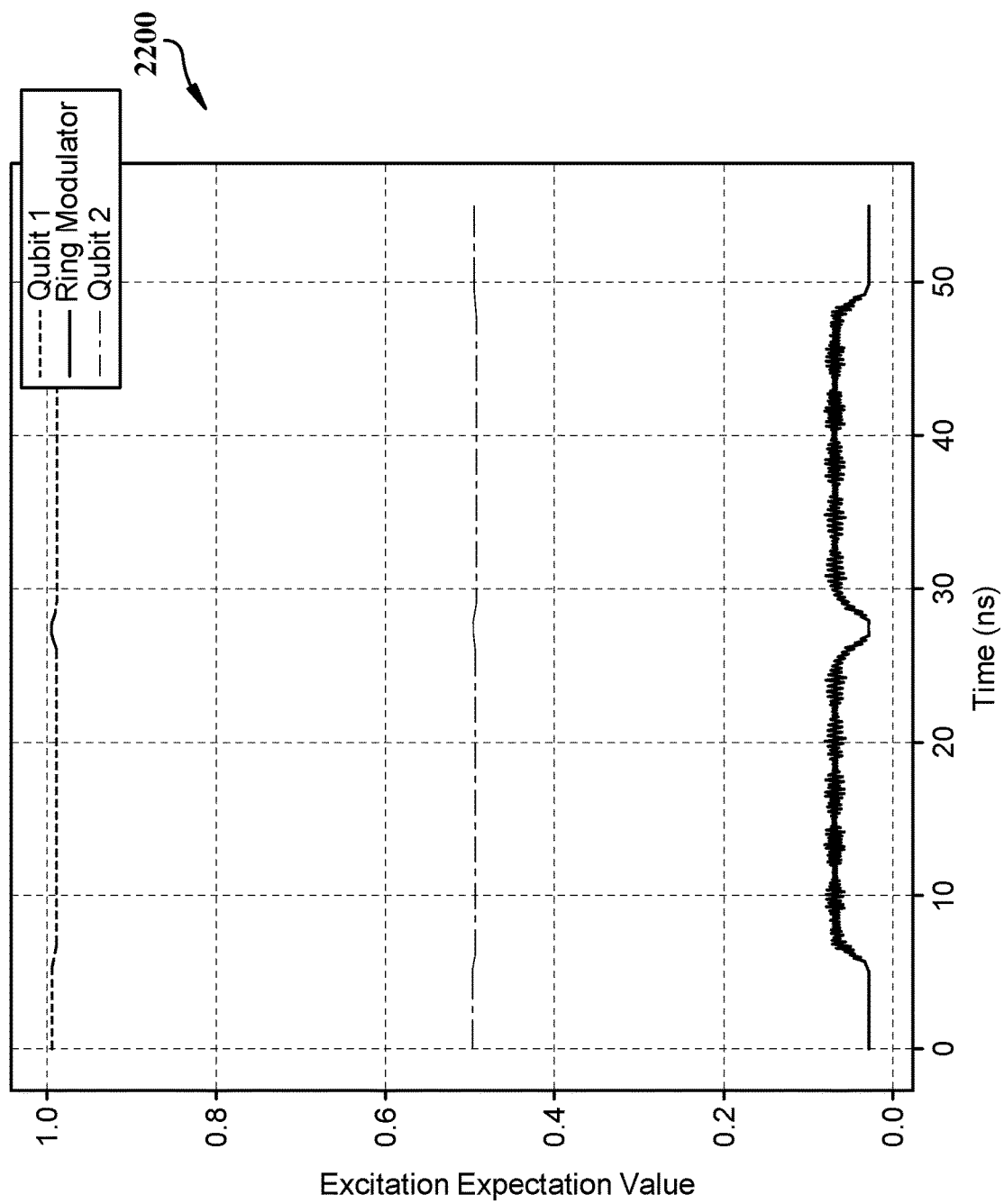
FIG. 22 illustrates an example, non-limiting graph depicting excitation expectation value versus time, in accordance with one or more embodiments described herein.
Figure 23:
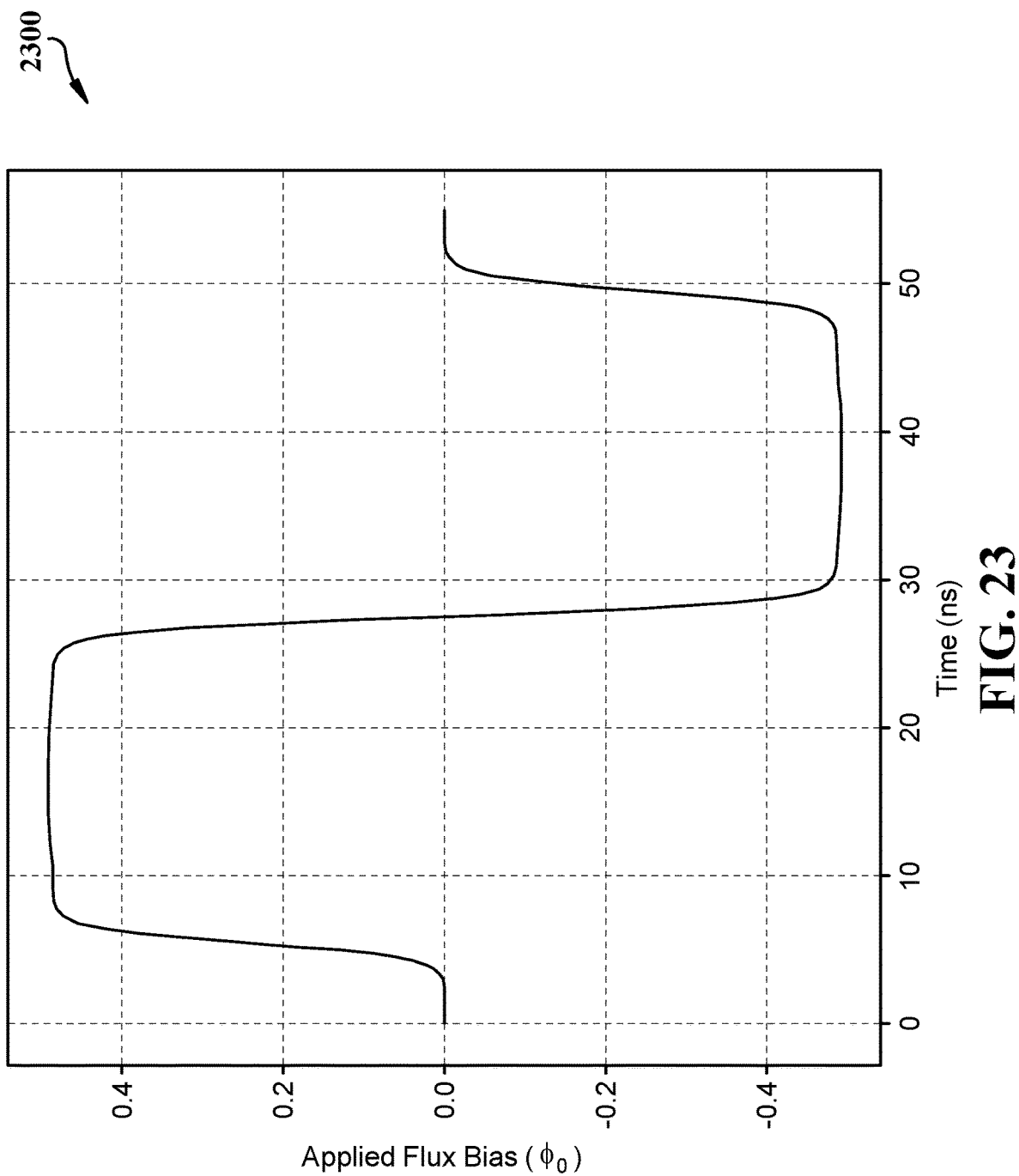
FIG. 23 illustrates an example, non-limiting graph depicting applied flux bias versus time to enact a two-qubit gate via a JRM, in accordance with one or more embodiments described herein.

FIGS. 20-23 illustrate example, non-limiting graphs corresponding to simulation results obtained for the example device 1900 of FIG. 19. FIG. 20 illustrates an example, non-limiting graph 2000 depicting a relative phase difference between |01> and |11> quantum states versus time, in accordance with one or more embodiments described herein. FIG. 21 illustrates an example, non-limiting graph 2100 depicting occupation probability versus Eigenstate, in accordance with one or more embodiments described herein. FIG. 22 illustrates an example, non-limiting graph 2200 depicting excitation expectation value versus time, in accordance with one or more embodiments described herein. FIG. 23 illustrates an example, non-limiting graph 2300 depicting applied flux bias versus time to enact a two-qubit gate via a JRM, in accordance with one or more embodiments described herein.

Figure 24:
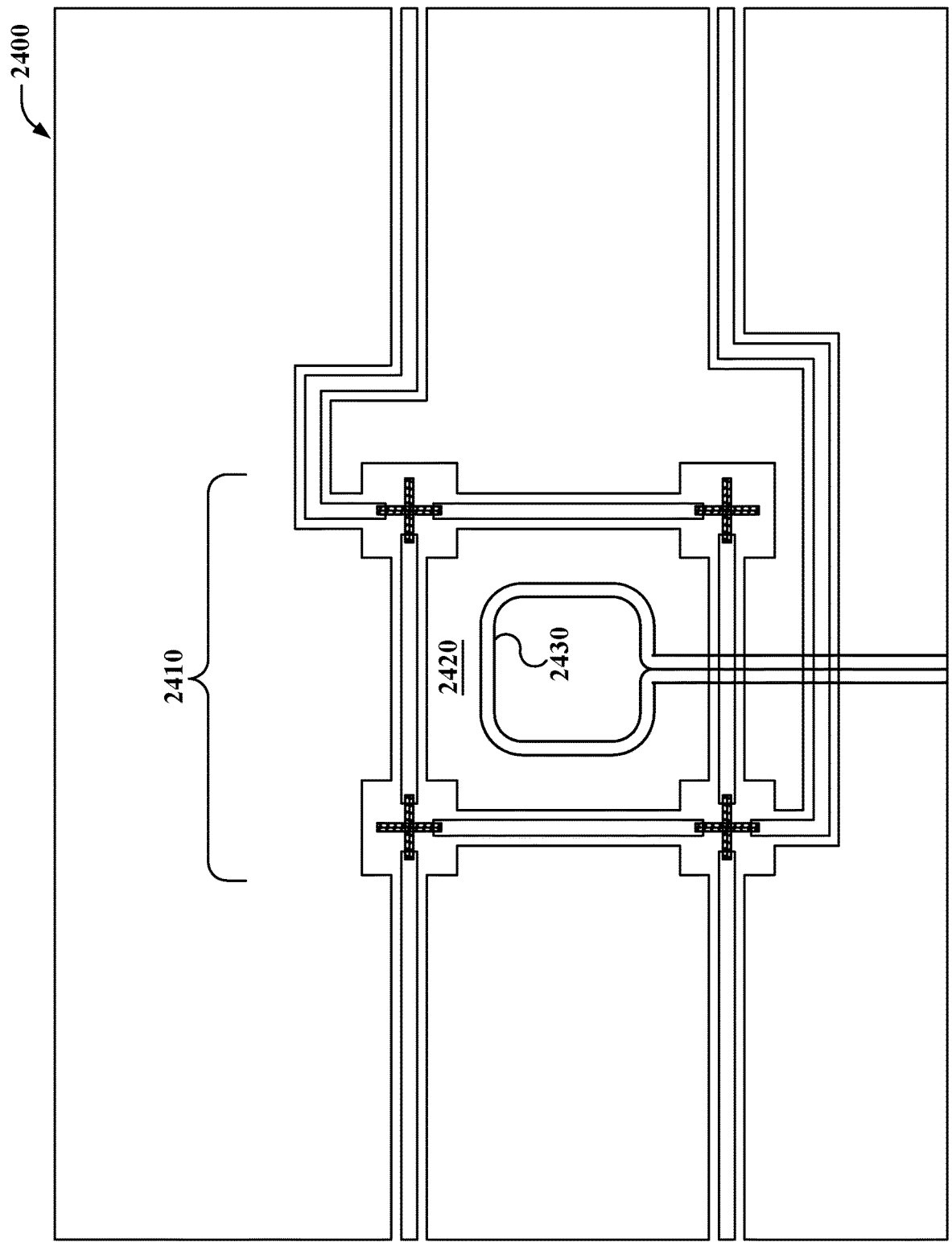
FIGS. 24-25 illustrate top views of example, non-limiting devices that can facilitate flux coupling, in accordance with one or more embodiments described herein.

FIG. 24 illustrates a top view of an example, non-limiting device 2400 that can facilitate flux coupling, in accordance with one or more embodiments described herein. Device 2400 includes a JRM 2410 positioned over an interposer 2420. Intervening between JRM 2410 and interposer 2420 is a flux bias line 2430 built on interposer 2420 that forms a loop under JRM 2410.

Figure 25:
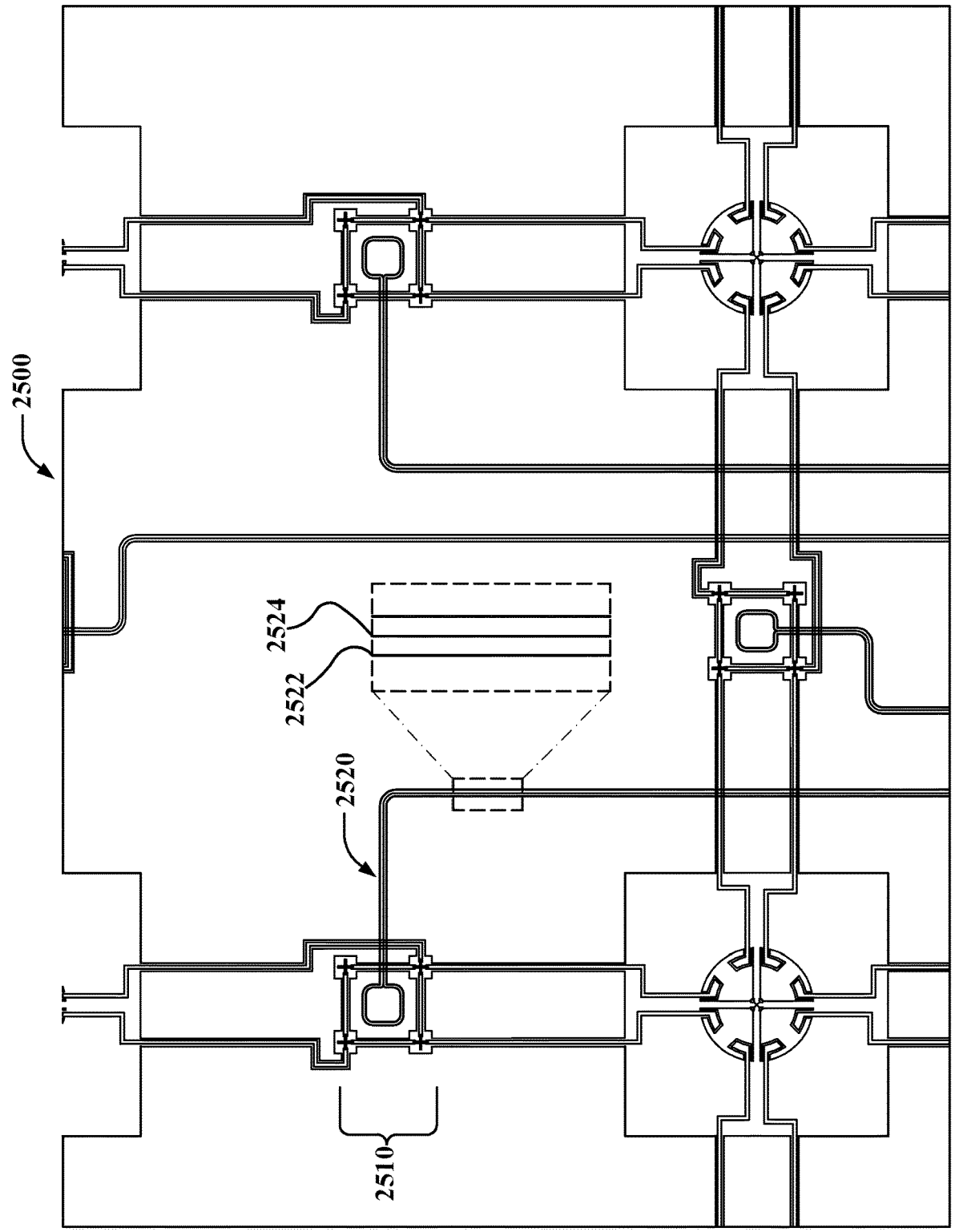

FIG. 25 illustrates a top view of an example, non-limiting device 2500 that can facilitate flux coupling, in accordance with one or more embodiments described herein. Device 2500 includes a JRM 2510 and a flux bias line 2520 comprising an incoming flux bias line 2522 that forms a loop proximate to JRM 2510. Instead of coupling flux bias line 2520 to ground for a return path, flux bias line 2520 further comprises a return path 2524 that is routed alongside of incoming flux bias line 2522. In an embodiment, providing flux bias line 2520 with a return path 2524 routed alongside of incoming flux bias line 2522 facilitates limiting unintended stray flux coupling within device 2500.

Figure 26:
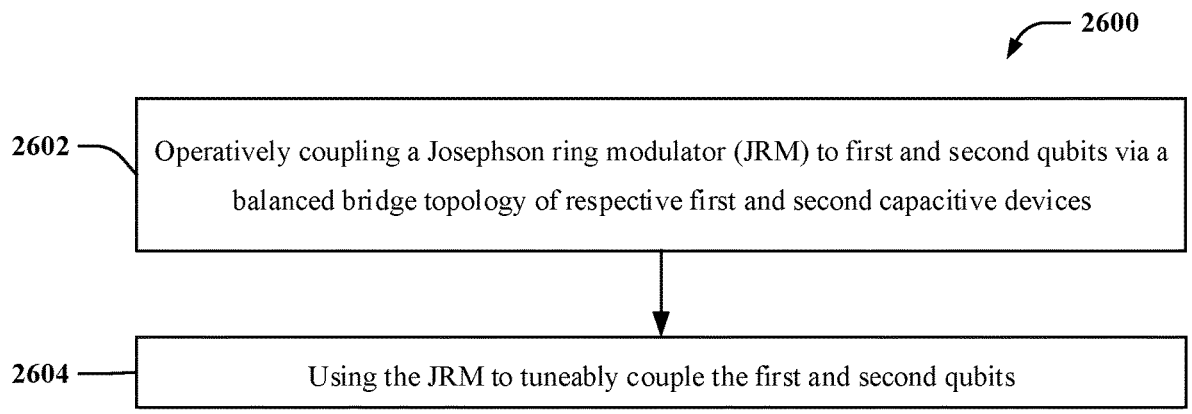
FIGS. 26-27 illustrate flow diagrams of example, non-limiting computer-implemented methods that can facilitate a quantum gate between qubits using a JRM, in accordance with one or more embodiments described herein.

FIG. 26 illustrates a flow diagram of an example, non-limiting computer-implemented method 2600 of facilitating a quantum gate between qubits using a JRM in accordance with one or more embodiments described herein. Repetitive description of like elements employed in other embodiments described herein is omitted for sake of brevity. At 2602, the computer-implemented method 2600 can comprise operatively coupling a JRM (e.g., JRM 110) to first and second qubits (e.g., first qubit 120 and second qubit 130) in a balanced bridge topology via respective first and second capacitive devices (e.g., first capacitive devices 140 and second capacitive devices 150). At 2604, the computer-implemented method 2600 can comprise using the JRM to tuneably couple the first and second qubits. In an embodiment, the first and second qubits remain decoupled until the bias is applied to the JRM.

Figure 27:
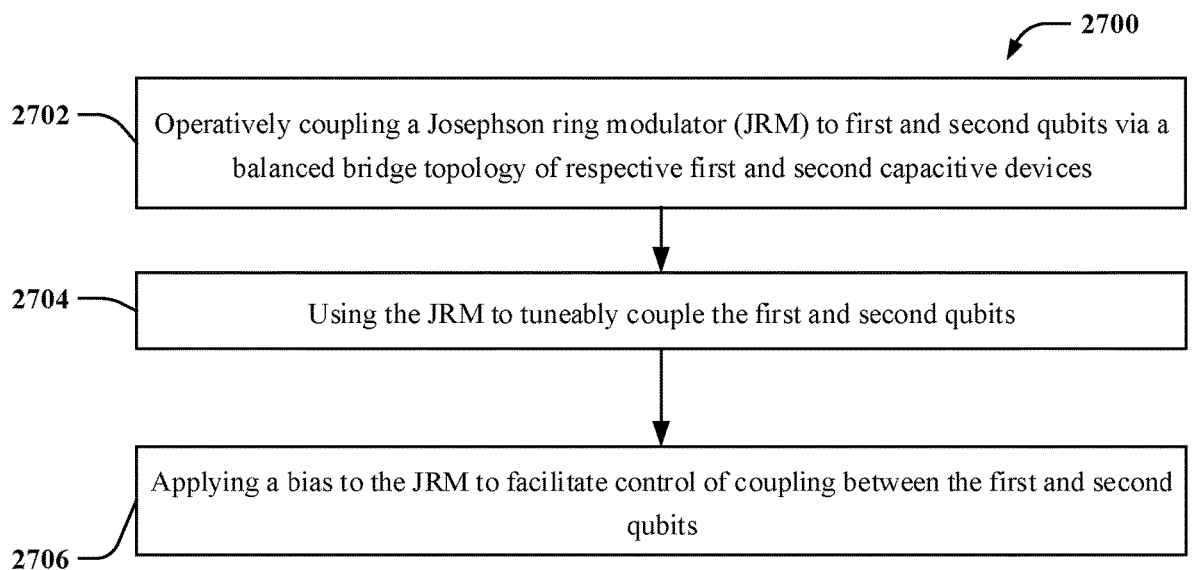

FIG. 27 illustrates a flow diagram of another example, non-limiting computer-implemented method 2700 of facilitating a quantum gate between qubits using a JRM in accordance with one or more embodiments described herein. Repetitive description of like elements employed in other embodiments described herein is omitted for sake of brevity. At 2702, the computer-implemented method 2700 can comprise operatively coupling a JRM (e.g., JRM 110) to first and second qubits (e.g., first qubit 120 and second qubit 130) in a balanced bridge topology via respective first and second capacitive devices (e.g., first capacitive devices 140 and second capacitive devices 150). At 2704, the computer-implemented method 2700 can comprise using the JRM to tuneably couple the first and second qubits. At 2706, the computer-implemented method 2700 can comprise applying a bias to the JRM to facilitate control of coupling between the first and second qubits.

In an embodiment, the first and second qubits remain decoupled until the bias is applied to the JRM. In an embodiment, the computer-implemented method 2700 can further comprise applying an RF charge bias signal to the JRM to drive parametric conversion between the first and second qubits. For example, biasing component 410 of FIG. 4 can be used to apply the RF charge bias signal to the JRM. In an embodiment, the computer-implemented method 2700 can further comprise applying an RF flux bias signal to the JRM to drive parametric conversion between the first and second qubits. For example, biasing component 310 of FIG. 3 can be used to apply the RF flux bias signal to the JRM.

In an embodiment, the first and second qubits are degenerate qubits. In this embodiment, the computer-implemented method 2700 can further comprise applying a DC flux bias signal to the JRM to drive an excitation swap between the first and second qubits. For example, biasing component 310 of FIG. 3 can be used to apply the DC flux bias signal to the JRM. In an embodiment, the first and second qubits are non-degenerate qubits. In this embodiment, the computer-implemented method 2700 can further comprise applying a DC flux bias signal to the JRM to drive ZZ interaction between the first and second qubits. For example, biasing component 310 of FIG. 3 can be used to apply the DC flux bias signal to the JRM. In an embodiment, the computer-implemented method 2700 can further comprise controlling polarity of the coupling between the first and second qubits by adjusting polarity of the bias applied to the JRM. For example, polarity components 340 and/or 440 of FIGS. 3-4, respectively, can be used to adjust polarity of the bias applied to the JRM.

Figure 28:
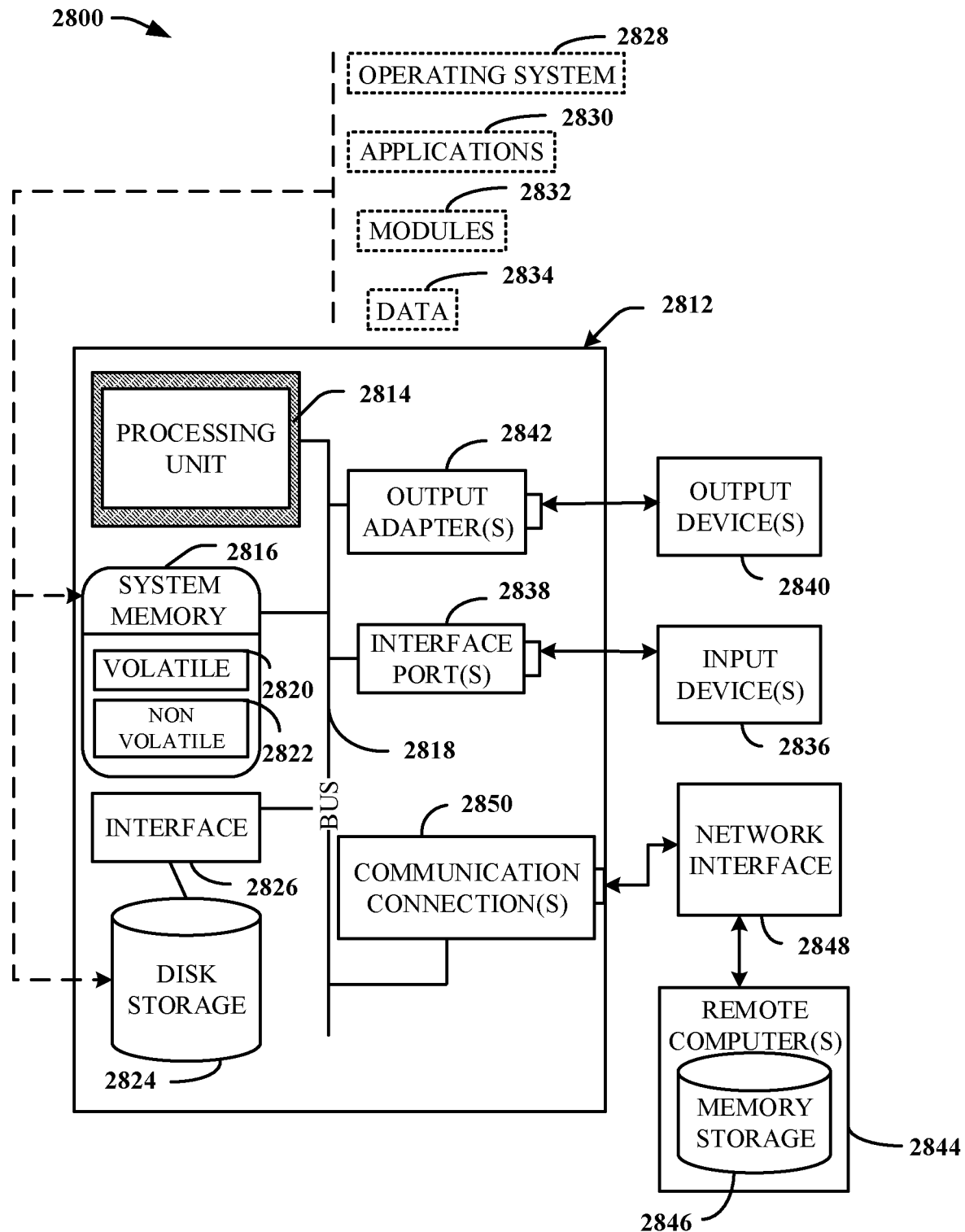
FIG. 28 illustrates a block diagram of an example, non-limiting operating environment in which one or more embodiments described herein can be facilitated.

In order to provide a context for the various aspects of the disclosed subject matter, FIG. 28 as well as the following discussion are intended to provide a general description of a suitable environment in which the various aspects of the disclosed subject matter can be implemented. FIG. 28 illustrates a block diagram of an example, non-limiting operating environment 2800 in which one or more embodiments described herein can be facilitated. For example, as described below, operating environment 2800 can be used to implement the example, non-limiting multi-step fabrication sequences described above with reference to FIGS. 1-4 that can be implemented to fabricate devices (e.g., devices 100, 200, 300, and/or 400) in accordance with one or more embodiments of the subject disclosure as described herein. In another example, as described below, operating environment 2800 can be used to implement one or more of the example, non-limiting computer-implemented methods 2600 and/or 2700 described above with reference to FIGS. 26-27. Repetitive description of like elements and/or processes employed in other embodiments described herein is omitted for sake of brevity.

The example, non-limiting multi-step fabrication sequences described above with reference to FIGS. 1-4, which can be implemented to fabricate devices 100, 200, 300, and/or 400 can be implemented by a computing system (e.g., operating environment 2800 illustrated in FIG. 28 and described below) and/or a computing device (e.g., computer 2812 illustrated in FIG. 28 and described below). In non-limiting example embodiments, such computing system (e.g., operating environment 2800) and/or such computing device (e.g., computer 2812) can comprise one or more processors and one or more memory devices that can store executable instructions thereon that, when executed by the one or more processors, can facilitate performance of the example, non-limiting multi-step fabrication sequences described above with reference to FIGS. 1-4. As a non-limiting example, the one or more processors can facilitate performance of the example, non-limiting multi-step fabrication sequences described above with reference to FIGS. 1-4 by directing and/or controlling one or more systems and/or equipment operable to perform semiconductor and/or superconductor device fabrication.

In another example, one or more of the example, non-limiting computer-implemented methods 2600 and/or 2700 described above with reference to FIGS. 26-27 can also be implemented (e.g., executed) by operating environment 2800. As a non-limiting example, the one or more processors of such a computing device (e.g., computer 2812) can facilitate performance of one or more of the example, non-limiting computer implemented methods 2600 and/or 2700 described above with reference to FIGS. 26-27 by directing and/or controlling one or more systems and/or equipment (e.g., biasing component 310, biasing component 410, polarity component 340, and/or polarity component 440) operable to perform the operations and/or routines of such computer-implemented method(s).

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

With reference to FIG. 28, a suitable operating environment 2800 for implementing various aspects of this disclosure can also include a computer 2812. The computer 2812 can also include a processing unit 2814, a system memory 2816, and a system bus 2818. The system bus 2818 couples system components including, but not limited to, the system memory 2816 to the processing unit 2814. The processing unit 2814 can be any of various available processors. Dual microprocessors and other multiprocessor architectures also can be employed as the processing unit 2814. The system bus 2818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 2816 can also include volatile memory 2820 and nonvolatile memory 2822. The basic input/output system (BIOS), containing the basic routines to transfer information between elements within the computer 2812, such as during start-up, is stored in nonvolatile memory 2822. Computer 2812 can also include removable/non-removable, volatile/non-volatile computer storage media. FIG. 28 illustrates, for example, a disk storage 2824. Disk storage 2824 can also include, but is not limited to, devices like a magnetic disk drive, floppy disk drive, tape drive, Jaz drive, Zip drive, LS-100 drive, flash memory card, or memory stick. The disk storage 2824 also can include storage media separately or in combination with other storage media. To facilitate connection of the disk storage 2824 to the system bus 2818, a removable or non-removable interface is typically used, such as interface 2826. FIG. 28 also depicts software that acts as an intermediary between users and the basic computer resources described in the suitable operating environment 2800. Such software can also include, for example, an operating system 2828. Operating system 2828, which can be stored on disk storage 2824, acts to control and allocate resources of the computer 2812.

System applications 2830 take advantage of the management of resources by operating system 2828 through program modules 2832 and program data 2834, e.g., stored either in system memory 2816 or on disk storage 2824. It is to be appreciated that this disclosure can be implemented with various operating systems or combinations of operating systems. A user enters commands or information into the computer 2812 through input device(s) 2836. Input devices 2836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2814 through the system bus 2818 via interface port(s) 2838. Interface port(s) 2838 include, for example, a serial port, a parallel port, a game port, and a universal serial bus (USB). Output device(s) 2840 use some of the same type of ports as input device(s) 2836. Thus, for example, a USB port can be used to provide input to computer 2812, and to output information from computer 2812 to an output device 2840. Output adapter 2842 is provided to illustrate that there are some output devices 2840 like monitors, speakers, and printers, among other output devices 2840, which require special adapters. The output adapters 2842 include, by way of illustration and not limitation, video and sound cards that provide a means of connection between the output device 2840 and the system bus 2818. It should be noted that other devices and/or systems of devices provide both input and output capabilities such as remote computer(s) 2844.

Computer 2812 can operate in a networked environment using logical connections to one or more remote computers, such as remote computer(s) 2844. The remote computer(s) 2844 can be a computer, a server, a router, a network PC, a workstation, a microprocessor based appliance, a peer device or other common network node and the like, and typically can also include many or all of the elements described relative to computer 2812. For purposes of brevity, only a memory storage device 2846 is illustrated with remote computer(s) 2844. Remote computer(s) 2844 is logically connected to computer 2812 through a network interface 2848 and then physically connected via communication connection 2850. Network interface 2848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2850 refers to the hardware/software employed to connect the network interface 2848 to the system bus 2818. While communication connection 2850 is shown for illustrative clarity inside computer 2812, it can also be external to computer 2812. The hardware/software for connection to the network interface 2848 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum coupling device, comprising:
   a Josephson ring modulator (JRM) that is operatively coupled to first and second qubits in a balanced bridge topology via respective first and second capacitive devices, wherein the JRM provides tunable coupling between the first and second qubits.

2. The quantum coupling device of claim 1, further comprising a biasing component that applies a bias to the JRM to facilitate control of coupling between the first and second qubits.

3. The quantum coupling device of claim 2, wherein the first and second qubits remain decoupled until the bias is applied to the JRM.

4. The quantum coupling device of claim 2, further comprising a polarity component that controls polarity of the coupling between the first and second qubits by adjusting polarity of the bias applied to the JRM.

5. The quantum coupling device of claim 2, wherein the biasing component applies a radio frequency (RF) charge bias signal to the JRM to drive parametric conversion between the first and second qubits.

6. The quantum coupling device of claim 5, wherein the RF charge bias signal comprises a difference frequency defined by respective frequencies of the first and second qubits.

7. The quantum coupling device of claim 2, wherein the biasing component applies a radio frequency (RF) flux bias signal to the JRM to drive parametric conversion between the first and second qubits.

8. The quantum coupling device of claim 7, wherein the RF flux bias signal comprises a difference frequency defined by respective frequencies of the first and second qubits.

9. The quantum coupling device of claim 1, wherein the first and second qubits are degenerate qubits, and wherein application of a DC flux bias signal to the JRM drives an excitation swap between the first and second qubits.

10. The quantum coupling device of claim 1, wherein the first and second qubits are non-degenerate qubits, and wherein application of a DC flux bias signal to the JRM drives ZZ interaction between the first and second qubits.

11. The quantum coupling device of claim 1, further comprising a flux bias line built on an interposer that forms a loop under the JRM.

12. The quantum coupling device of claim 11, wherein the flux bias line comprises an incoming flux bias line and a return path routed alongside of the incoming flux bias line.

13. The quantum coupling device of claim 1, wherein the first capacitive devices are formed inside a paddle of the first qubit.

14. A computer-implemented method, comprising:
operatively coupling a Josephson ring modulator (JRM) to first and second qubits in a balanced bridge topology via respective first and second capacitive devices; and
using the JRM to tuneably couple the first and second qubits.

15. The computer-implemented method of claim 14, further comprising applying a bias to the JRM to facilitate control of coupling between the first and second qubits.

16. The computer-implemented method of claim 15, wherein the first and second qubits remain decoupled until the bias is applied to the JRM.

17. The computer-implemented method of claim 15, further comprising controlling polarity of the coupling between the first and second qubits by adjusting polarity of the bias applied to the JRM.

18. The computer-implemented method of claim 15, further comprising applying a radio frequency (RF) charge bias signal to the JRM to drive parametric conversion between the first and second qubits.

19. The computer-implemented method of claim 15, further comprising applying a radio frequency (RF) flux bias signal to the JRM to drive parametric conversion between the first and second qubits.

20. The computer-implemented method of claim 15, wherein the first and second qubits are degenerate qubits, and the method further comprises applying a DC flux bias signal to the JRM to drive an excitation swap between the first and second qubits.

21. The computer-implemented method of claim 15, wherein the first and second qubits are non-degenerate qubits, and the method further comprises applying a DC flux bias signal to the JRM to drive ZZ interaction between the first and second qubits.

22. A quantum coupling system, comprising:
a Josephson ring modulator (JRM);
a first qubit coupled to the JRM via a first inductive component; and
a second qubit coupled to the JRM via a second inductive component, wherein the first and second qubits are coupled to the JRM via the respective first and second reactive coupling devices in a balanced bridge topology, and wherein the JRM can provide tunable coupling between the first and the second qubits.

23. The system of claim 22, further comprising a biasing component that applies a bias to the JRM to control coupling between the first and second qubits.

24. The quantum coupling device of claim 22, wherein the first and second qubits remain decoupled until a bias is applied to the JRM.

* * * * *